(12) United States Patent
Alshin et al.

(10) Patent No.: US 9,661,326 B2
(45) Date of Patent: May 23, 2017

(54) METHOD AND APPARATUS FOR ENTROPY ENCODING/DECODING

(75) Inventors: Alexander Alshin, Suwon-si (KR); Elena Alshina, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 682 days.

(21) Appl. No.: 14/130,028

(22) PCT Filed: Jun. 28, 2012

(86) PCT No.: PCT/KR2012/005147
§ 371 (c)(1),
(2), (4) Date: Feb. 20, 2014

(87) PCT Pub. No.: WO2013/002585
PCT Pub. Date: Jan. 3, 2013

(65) Prior Publication Data
US 2014/0177708 A1    Jun. 26, 2014

Related U.S. Application Data

(60) Provisional application No. 61/502,021, filed on Jun. 28, 2011.

(51) Int. Cl.
*H04N 7/12* (2006.01)
*H04N 19/50* (2014.01)
(Continued)

(52) U.S. Cl.
CPC .... *H04N 19/00569* (2013.01); *H03M 7/4006* (2013.01); *H04N 19/13* (2014.11); *H04N 19/91* (2014.11); *H04N 19/96* (2014.11)

(58) Field of Classification Search
CPC .... H04N 19/13; H04N 19/176; H04N 19/124; H04N 19/593; H03M 7/4006
(Continued)

(56) References Cited

U.S. PATENT DOCUMENTS

| 9,083,374 B2* | 7/2015 | Marpe | H03M 7/40 |
| 2006/0232454 A1 | 10/2006 | Cha et al. | |
| 2009/0175332 A1* | 7/2009 | Karczewicz | H04N 19/176 375/240.03 |

FOREIGN PATENT DOCUMENTS

| JP | 2011-024001 A | 2/2011 |
| KR | 10-2006-0110713 A | 10/2006 |
| WO | 2011022047 A1 | 2/2011 |

OTHER PUBLICATIONS

Marpe, et al., "Context-Based Adaptive Binary Arithmetic Coding in the H.264/AVC Video Compression Standard", IEEE Transactions on Circuits and Systems for Video Technology, vol. 13, No. 7, Jul. 2003, pp. 620-636.

(Continued)

*Primary Examiner* — Gims Philippe
(74) *Attorney, Agent, or Firm* — Sughrue Mion, PLLC

(57) ABSTRACT

Provided are methods and apparatuses for entropy-encoding and entropy-decoding an image. The method for entropy-encoding an image includes operations of arithmetically encoding a binary value of a current coding symbol, by using a probability of a predefined binary value which is determined based on previously-coded symbols that are encoded before the current coding symbol; and updating the probability of the predefined binary value by using a plurality of scaling factors, according to the binary value of the current coding symbol.

12 Claims, 15 Drawing Sheets

(51) Int. Cl.
*H04N 19/91* (2014.01)
*H04N 19/96* (2014.01)
*H03M 7/40* (2006.01)
*H04N 19/13* (2014.01)

(58) Field of Classification Search
USPC ..................................... 375/240.01–240.29
See application file for complete search history.

(56) References Cited

OTHER PUBLICATIONS

International Search Report for PCT/KR2012/005147 dated Jan. 17, 2013 [PCT/ISA/210].
Written Opinion for PCT/KR2012/005147 dated Jan. 17, 2013 [PCT/ISA/237].
Communication dated May 15, 2015 issued by the European Patent Office in counterpart European Patent Application No. 12803573.0.
Alshin et al; "CE1 (subset B): Multi-parameter probability up-date for CABAC"; Joint Collaborative Team on Video Coding (JCT-VC); XP030110748; Nov. 9, 2011; pp. 1-4 (Doc No. JCTVC-G764).
Alshin et al; "Multi-parameter probability up-date for CABAC"; Joint Collaborative Team on Video Coding (JCT-VC); XP030009277; Jul. 2, 2011; pp. 1-5 (Doc No. JCTVC-F254).
Alshin et al; "High Precision Probability Estimation for CABAC"; 2013 Visual Communications and Image Processing; XP032543605; Nov. 17, 2013; 6 pgs.
Bin et al; "A High Speed CABAC Algorithm Based on Probability Estimation Update"; Fourth International Conference on Image and Graphics; XP031131284; Aug. 1, 2007; pp. 195-199.

* cited by examiner

CODING UNITS (1010)

METHOD AND APPARATUS FOR ENTROPY ENCODING/DECODING

TECHNICAL FIELD

The present invention relates to entropy coding and decoding, and more particularly, to a method and apparatus for updating a probability model in context-based binary arithmetic encoding/decoding.

BACKGROUND ART

In current international video coding standards such as H.264 and MPEG-4, a video signal is hierarchically split into a sequence, a frame, a slice, a macroblock, and a block, and the block is a minimum processing unit. In encoding, residual data of the block is obtained from an intra-frame or via an inter-frame prediction. Also, the residual data is compressed via transformation, quantization, scanning, run length coding, and entropy coding. In decoding, a processing procedure is performed backward, relative to the encoding. First, a coefficient of a transformation block that is generated in entropy encoding is extracted from a bitstream. Then, the residual data of the block is restored via inverse-quantization and inverse-transformation, and prediction information is used to restore video data of the block.

DETAILED DESCRIPTION OF THE INVENTION

Technical Problem

The present invention is provided to increase image compression efficiency by improving a probability updating process performed in a context-based binary arithmetic coding (CABAC) process.

Technical Solution

According to embodiments of the present invention, a probability model is updated by using a plurality of scaling factors.

Advantageous Effects

According to embodiments of the present invention, performance of context-based binary arithmetic coding (CABAC) is improved.

BEST MODE

According to an aspect of the present invention, there is provided a method of entropy-encoding an image, the method including operations of arithmetically encoding a binary value of a current coding symbol, by using a probability of a predefined binary value which is determined based on previously-coded symbols that are encoded before the current coding symbol; and updating the probability of the predefined binary value by using a plurality of scaling factors, according to the binary value of the current coding symbol.

According to another aspect of the present invention, there is provided an entropy encoding apparatus for entropy-encoding an image, the entropy encoding apparatus including a binary arithmetic coder for arithmetically encoding a binary value of a current coding symbol, by using a probability of a predefined binary value which is determined based on previously-coded symbols that are encoded before the current coding symbol; and a context modeler for updating the probability of the predefined binary value by using a plurality of scaling factors, according to the binary value of the current coding symbol.

According to another aspect of the present invention, there is provided a method of entropy-decoding an image, the method including operations of arithmetically decoding a binary value of a current coding symbol, by using a probability of a predefined binary value which is determined based on previously-coded symbols that are decoded before the current coding symbol; and updating the probability of the predefined binary value by using a plurality of scaling factors, according to the binary value of the current coding symbol.

According to another aspect of the present invention, there is provided an entropy decoding apparatus for entropy-decoding an image, the entropy decoding apparatus including a binary arithmetic decoder for arithmetically decoding a binary value of a current coding symbol, by using a probability of a predefined binary value which is determined based on previously-coded symbols that are decoded before the current coding symbol; and a context modeler for updating the probability of the predefined binary value by using a plurality of scaling factors, according to the binary value of the current coding symbol.

MODE OF THE INVENTION

Hereinafter, the present invention will be described in detail by explaining exemplary embodiments of the invention with reference to the attached drawings.

Figure 1:
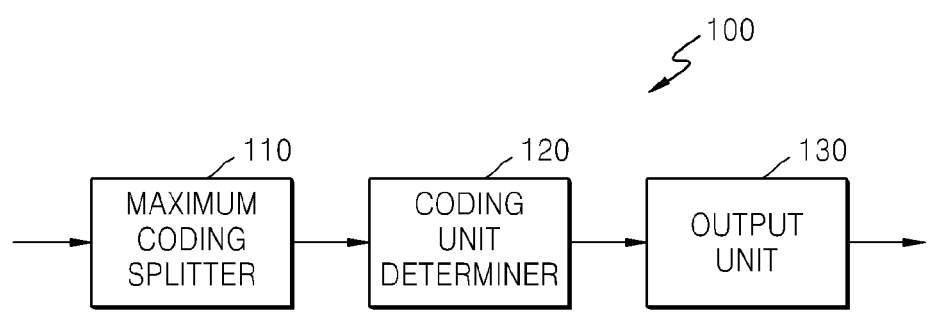
FIG. 1 is a block diagram of an apparatus for encoding a video, according to an embodiment of the present invention.

FIG. 1 is a block diagram of a video encoding apparatus 100, according to an embodiment of the present invention.

The video encoding apparatus 100 includes a maximum coding unit splitter 110, a coding unit determiner 120, and an output unit 130.

The maximum coding unit splitter 110 may split a current picture based on a maximum coding unit for the current picture of an image. If the current picture is larger than the maximum coding unit, image data of the current picture may be split into the at least one maximum coding unit. The maximum coding unit according to an embodiment of the present invention may be a data unit having a size of 32×32, 64×64, 128×128, 256×256, etc., wherein a shape of the data unit is a square having a width and a length that are each a multiple of 2 and greater than 8. The image data may be output to the coding unit determiner 120 according to the at least one maximum coding unit.

A coding unit according to an embodiment of the present invention may be characterized by a maximum size and a depth. The depth denotes a number of times the coding unit is spatially split from the maximum coding unit, and as the depth deepens, deeper encoding units according to depths may be split from the maximum coding unit to a minimum coding unit. A depth of the maximum coding unit is an uppermost depth and a depth of the minimum coding unit is a lowermost depth. Since a size of a coding unit corresponding to each depth decreases as the depth of the maximum coding unit deepens, a coding unit corresponding to an upper depth may include a plurality of coding units corresponding to lower depths.

As described above, the image data of the current picture is split into the maximum coding units according to a maximum size of the coding unit, and each of the maximum coding units may include deeper coding units that are split according to depths. Since the maximum coding unit according to an embodiment of the present invention is split according to depths, the image data of a spatial domain included in the maximum coding unit may be hierarchically classified according to depths.

A maximum depth and a maximum size of a coding unit, which limit the total number of times a height and a width of the maximum coding unit are hierarchically split may be predetermined.

The coding unit determiner 120 encodes at least one split region obtained by splitting a region of the maximum coding unit according to depths, and determines a depth to output a finally encoded image data according to the at least one split region. In other words, the coding unit determiner 120 determines a coded depth by encoding the image data in the deeper coding units according to depths, according to the maximum coding unit of the current picture, and selecting a depth having the least encoding error. Thus, the encoded image data of the coding unit corresponding to the determined coded depth is finally output. Also, the coding units corresponding to the coded depth may be regarded as encoded coding units.

The determined coded depth and the encoded image data according to the determined coded depth are output to the output unit 130.

The image data in the maximum coding unit is encoded based on the deeper coding units corresponding to at least one depth equal to or below the maximum depth, and results of encoding the image data are compared based on each of the deeper coding units. A depth having the least encoding error may be selected after comparing encoding errors of the deeper coding units. At least one coded depth may be selected for each maximum coding unit.

The size of the maximum coding unit is split as a coding unit is hierarchically split according to depths, and as the number of coding units increases. Also, even if coding units correspond to same depth in one maximum coding unit, it is determined whether to split each of the coding units corresponding to the same depth to a lower depth by measuring an encoding error of the image data of the each coding unit, separately. Accordingly, even when image data is included in one maximum coding unit, the image data is split to regions according to the depths and the encoding errors may differ according to regions in the one maximum coding unit, and thus the coded depths may differ according to regions in the image data. Thus, one or more coded depths may be determined in one maximum coding unit, and the image data of the maximum coding unit may be divided according to coding units of at least one coded depth.

Accordingly, the coding unit determiner 120 may determine coding units having a tree structure included in the maximum coding unit. The 'coding units having a tree structure' according to an embodiment of the present invention include coding units corresponding to a depth determined to be the coded depth, from among all deeper coding units included in the maximum coding unit. A coding unit of a coded depth may be hierarchically determined according to depths in the same region of the maximum coding unit, and may be independently determined in different regions. Similarly, a coded depth in a current region may be independently determined from a coded depth in another region.

A maximum depth according to an embodiment of the present invention is an index related to the number of splitting times from a maximum coding unit to a minimum coding unit. A first maximum depth according to an embodiment of the present invention may denote the total number of splitting times from the maximum coding unit to the minimum coding unit. A second maximum depth according to an embodiment of the present invention may denote the total number of depth levels from the maximum coding unit to the minimum coding unit. For example, when a depth of the maximum coding unit is 0, a depth of a coding unit, in which the maximum coding unit is split once, may be set to 1, and a depth of a coding unit, in which the maximum coding unit is split twice, may be set to 2. Here, if the minimum coding unit is a coding unit in which the maximum coding unit is split four times, 5 depth levels of depths 0, 1, 2, 3 and 4 exist, and thus the first maximum depth may be set to 4, and the second maximum depth may be set to 5.

Prediction encoding and transformation may be performed according to the maximum coding unit. The prediction encoding and the transformation are also performed based on the deeper coding units according to a depth equal to or depths less than the maximum depth, according to the maximum coding unit. Transformation may be performed according to method of orthogonal transformation or integer transformation.

Since the number of deeper coding units increases whenever the maximum coding unit is split according to depths, encoding including the prediction encoding and the transformation is performed on all of the deeper coding units generated as the depth deepens. For convenience of description, the prediction encoding and the transformation will now be described based on a coding unit of a current depth, in a maximum coding unit.

The video encoding apparatus 100 may variously select a size or shape of a data unit for encoding the image data. In order to encode the image data, operations, such as prediction encoding, transformation, and entropy encoding, are performed, and at this time, the same data unit may be used for all operations or different data units may be used for each operation.

For example, the video encoding apparatus 100 may select not only a coding unit for encoding the image data, but also a data unit different from the coding unit so as to perform the prediction encoding on the image data in the coding unit.

In order to perform prediction encoding in the maximum coding unit, the prediction encoding may be performed based on a coding unit corresponding to a coded depth, i.e., based on a coding unit that is no longer split to coding units corresponding to a lower depth. Hereinafter, the coding unit that is no longer split and becomes a basis unit for prediction encoding will now be referred to as a 'prediction unit'. A partition obtained by splitting the prediction unit may include a prediction unit or a data unit obtained by splitting at least one of a height and a width of the prediction unit.

For example, when a coding unit of 2N×2N (where N is a positive integer) is no longer split and becomes a prediction unit of 2N×2N, and a size of a partition may be 2N×2N, 2N×N, N×2N, or N×N. Examples of a partition type include symmetrical partitions that are obtained by symmetrically splitting a height or width of the prediction unit, partitions obtained by asymmetrically splitting the height or width of the prediction unit, such as 1:n or n:1, partitions that are obtained by geometrically splitting the prediction unit, and partitions having arbitrary shapes.

A prediction mode of the prediction unit may be at least one of an intra mode, a inter mode, and a skip mode. For example, the intra mode or the inter mode may be performed on the partition of 2N×2N, 2N×N, N×2N, or N×N. Also, the skip mode may be performed only on the partition of 2N×2N. The encoding is independently performed on one prediction unit in a coding unit, thereby selecting a prediction mode having a least encoding error.

The video encoding apparatus 100 may also perform the transformation on the image data in a coding unit based not only on the coding unit for encoding the image data, but also based on a data unit that is different from the coding unit.

In order to perform the transformation in the coding unit, the transformation may be performed based on a data unit having a size smaller than or equal to the coding unit. For example, the data unit for the transformation may include a data unit for an intra mode and a data unit for an inter mode.

A data unit used as a base of the transformation will now be referred to as a 'transformation unit'. A transformation depth indicating the number of splitting times to reach the transformation unit by splitting the height and width of the coding unit may also be set in the transformation unit. For example, in a current coding unit of 2N×2N, a transformation depth may be 0 when the size of a transformation unit is also 2N×2N, may be 1 when each of the height and width of the current coding unit is split into two equal parts, totally split into 4^1 transformation units, and the size of the transformation unit is thus N×N, and may be 2 when each of the height and width of the current coding unit is split into four equal parts, totally split into 4^2 transformation units and the size of the transformation unit is thus N/2×N/2. For example, the transformation unit may be set according to a hierarchical tree structure, in which a transformation unit of an upper transformation depth is split into four transformation units of a lower transformation depth according to the hierarchical characteristics of a transformation depth.

Similarly to the coding unit, the transformation unit in the coding unit may be recursively split into smaller sized regions, so that the transformation unit may be determined independently in units of regions. Thus, residual data in the coding unit may be divided according to the transformation having the tree structure according to transformation depths.

Encoding information according to coding units corresponding to a coded depth requires not only information about the coded depth, but also about information related to prediction encoding and transformation. Accordingly, the coding unit determiner 120 not only determines a coded depth having a least encoding error, but also determines a partition type in a prediction unit, a prediction mode according to prediction units, and a size of a transformation unit for transformation.

Coding units according to a tree structure in a maximum coding unit and a method of determining a partition, according to embodiments of the present invention, will be described in detail later with reference to FIGS. 3 through 12.

The coding unit determiner 120 may measure an encoding error of deeper coding units according to depths by using Rate-Distortion Optimization based on Lagrangian multipliers.

The output unit 130 outputs the image data of the maximum coding unit, which is encoded based on the at least one coded depth determined by the coding unit determiner 120, and information about the encoding mode according to the coded depth, in bitstreams.

The encoded image data may be obtained by encoding residual data of an image.

The information about the encoding mode according to coded depth may include information about the coded depth, about the partition type in the prediction unit, the prediction mode, and the size of the transformation unit.

The information about the coded depth may be defined by using split information according to depths, which indicates whether encoding is performed on coding units of a lower depth instead of a current depth. If the current depth of the current coding unit is the coded depth, image data in the current coding unit is encoded and output, and thus the split information may be defined not to split the current coding unit to a lower depth. Alternatively, if the current depth of the current coding unit is not the coded depth, the encoding is performed on the coding unit of the lower depth, and thus the split information may be defined to split the current coding unit to obtain the coding units of the lower depth.

If the current depth is not the coded depth, encoding is performed on the coding unit that is split into the coding unit of the lower depth. Since at least one coding unit of the lower depth exists in one coding unit of the current depth, the encoding is repeatedly performed on each coding unit of the lower depth, and thus the encoding may be recursively performed for the coding units having the same depth.

Since the coding units having a tree structure are determined for one maximum coding unit, and information about at least one encoding mode is determined for a coding unit of a coded depth, information about at least one encoding mode may be determined for one maximum coding unit. Also, a coded depth of the image data of the maximum coding unit may be different according to locations since the image data is hierarchically split according to depths, and thus information about the coded depth and the encoding mode may be set for the image data.

Accordingly, the output unit 130 may assign encoding information about a corresponding coded depth and an encoding mode to at least one of the coding unit, the prediction unit, and a minimum unit included in the maximum coding unit.

The minimum unit according to an embodiment of the present invention may be a rectangular data unit obtained by splitting the minimum coding unit constituting the lowermost depth by 4, and may be a maximum rectangular data unit that may be included in all of the coding units, prediction units, partition units, and transformation units included in the maximum coding unit.

For example, the encoding information output through the output unit 130 may be classified into encoding information according to coding units, and encoding information according to prediction units. The encoding information according to the coding units may include the information about the prediction mode and about the size of the partitions. The encoding information according to the prediction units may include information about an estimated direction of an inter mode, about a reference image index of the inter mode, about a motion vector, about a chroma component of an intra mode, and about an interpolation method of the intra mode. Also, information about a maximum size of the coding unit defined according to pictures, slices, or GOPs, and information about a maximum depth may be inserted into a header of a bitstream.

In the video encoding apparatus 100, the deeper coding unit may be a coding unit obtained by dividing a height or width of a coding unit of an upper depth, which is one layer above, by two. In other words, when the size of the coding unit of the current depth is 2N×2N, the size of the coding unit of the lower depth is N×N. Also, the coding unit of the current depth having the size of 2N×2N may include maximum 4 of the coding unit of the lower depth.

Accordingly, the video encoding apparatus 100 may form the coding units having the tree structure by determining coding units having an optimum shape and an optimum size for each maximum coding unit, based on the size of the maximum coding unit and the maximum depth determined considering characteristics of the current picture. Also, since encoding may be performed on each maximum coding unit by using any one of various prediction modes and transformations, an optimum encoding mode may be determined considering characteristics of the coding unit of various image sizes.

Thus, if an image having high resolution or large data amount is encoded in a conventional macroblock, a number of macroblocks per picture excessively increases. Accordingly, a number of pieces of compressed information generated for each macroblock increases, and thus it is difficult to transmit the compressed information and data compression efficiency decreases. However, by using the video encoding apparatus 100, image compression efficiency may be increased since a coding unit is adjusted while considering characteristics of an image while increasing a maximum size of a coding unit while considering a size of the image.

Figure 2:
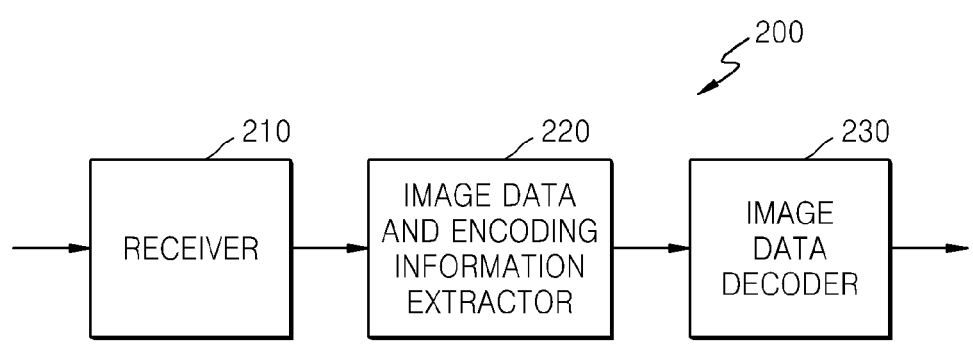
FIG. 2 is a block diagram of an apparatus for decoding a video, according to an embodiment of the present invention.

FIG. 2 is a block diagram of a video decoding apparatus 200, according to an embodiment of the present invention.

The video decoding apparatus 200 includes a receiver 210, an image data and encoding information extractor 220, and an image data decoder 230. Definitions of various terms, such as a coding unit, a depth, a prediction unit, a transformation unit, and information about various encoding modes, for various operations of the video decoding apparatus 200 are identical to those described with reference to FIG. 1 and the video encoding apparatus 100.

The receiver 205 receives and parses a bitstream of an encoded video. The image data and encoding information extractor 220 extracts encoded image data for each coding unit from the parsed bitstream, wherein the coding units have a tree structure according to each maximum coding unit, and outputs the extracted image data to the image data decoder 230. The image data and encoding information extractor 220 may extract information about a maximum size of a coding unit of a current picture, from a header about the current picture or SPS.

Also, the image data and encoding information extractor 220 extracts information about a coded depth and an encoding mode for the coding units having a tree structure according to each maximum coding unit, from the parsed bitstream. The extracted information about the coded depth and the encoding mode is output to the image data decoder 230. In other words, the image data in a bit stream is split into the maximum coding unit so that the image data decoder 230 decodes the image data for each maximum coding unit.

The information about the coded depth and the encoding mode according to the maximum coding unit may be set for information about at least one coding unit corresponding to the coded depth, and information about an encoding mode may include information about a partition type of a corresponding coding unit corresponding to the coded depth, about a prediction mode, and a size of a transformation unit. Also, splitting information according to depths may be extracted as the information about the coded depth.

The information about the coded depth and the encoding mode according to each maximum coding unit extracted by the image data and encoding information extractor 220 is information about a coded depth and an encoding mode determined to generate a minimum encoding error when an encoder, such as the video encoding apparatus 100, repeatedly performs encoding for each deeper coding unit according to depths according to each maximum coding unit. Accordingly, the video decoding apparatus 200 may restore an image by decoding the image data according to a coded depth and an encoding mode that generates the minimum encoding error.

Since encoding information about the coded depth and the encoding mode may be assigned to a predetermined data unit from among a corresponding coding unit, a prediction unit, and a minimum unit, the image data and encoding information extractor 220 may extract the information about the coded depth and the encoding mode according to the predetermined data units. The predetermined data units to which the same information about the coded depth and the encoding mode is assigned may be inferred to be the data units included in the same maximum coding unit.

The image data decoder 230 restores the current picture by decoding the image data in each maximum coding unit based on the information about the coded depth and the encoding mode according to the maximum coding units. In other words, the image data decoder 230 may decode the encoded image data based on the extracted information about the partition type, the prediction mode, and the transformation unit for each coding unit from among the coding units having the tree structure included in each maximum coding unit. A decoding process may include a prediction including intra prediction and motion compensation, and an inverse transformation. Inverse transformation may be performed according to method of inverse orthogonal transformation or inverse integer transformation.

The image data decoder 230 may perform intra prediction or motion compensation according to a partition and a prediction mode of each coding unit, based on the information about the partition type and the prediction mode of the prediction unit of the coding unit according to coded depths.

Also, the image data decoder 230 may perform inverse transformation according to each transformation unit in the coding unit, based on the information about the size of the transformation unit of the coding unit according to coded depths, so as to perform the inverse transformation according to maximum coding units.

The image data decoder 230 may determine at least one coded depth of a current maximum coding unit by using split information according to depths. If the split information indicates that image data is no longer split in the current depth, the current depth is a coded depth. Accordingly, the image data decoder 230 may decode encoded data of at least one coding unit corresponding to the each coded depth in the current maximum coding unit by using the information about the partition type of the prediction unit, the prediction mode, and the size of the transformation unit for each coding unit corresponding to the coded depth, and output the image data of the current maximum coding unit.

That is, data units containing the encoding information including the same split information may be gathered by observing the encoding information set assigned for the predetermined data unit from among the coding unit, the prediction unit, and the minimum unit, and the gathered data units may be considered to be one data unit to be decoded by the image data decoder 230 in the same encoding mode.

The video decoding apparatus 200 may obtain information about at least one coding unit that generates the minimum encoding error when encoding is recursively performed for each maximum coding unit, and may use the information to decode the current picture. In other words, the coding units having the tree structure determined to be the optimum coding units in each maximum coding unit may be decoded. Also, the maximum size of coding unit is determined considering resolution and an amount of image data.

Accordingly, even if image data has high resolution and a large amount of data, the image data may be efficiently decoded and restored by using a size of a coding unit and an encoding mode, which are adaptively determined according to characteristics of the image data, by using information about an optimum encoding mode received from an encoder.

A method of determining coding units having a tree structure, a prediction unit, and a transformation unit, according to an embodiment of the present invention, will now be described with reference to FIGS. 3 through 13.

Figure 3:
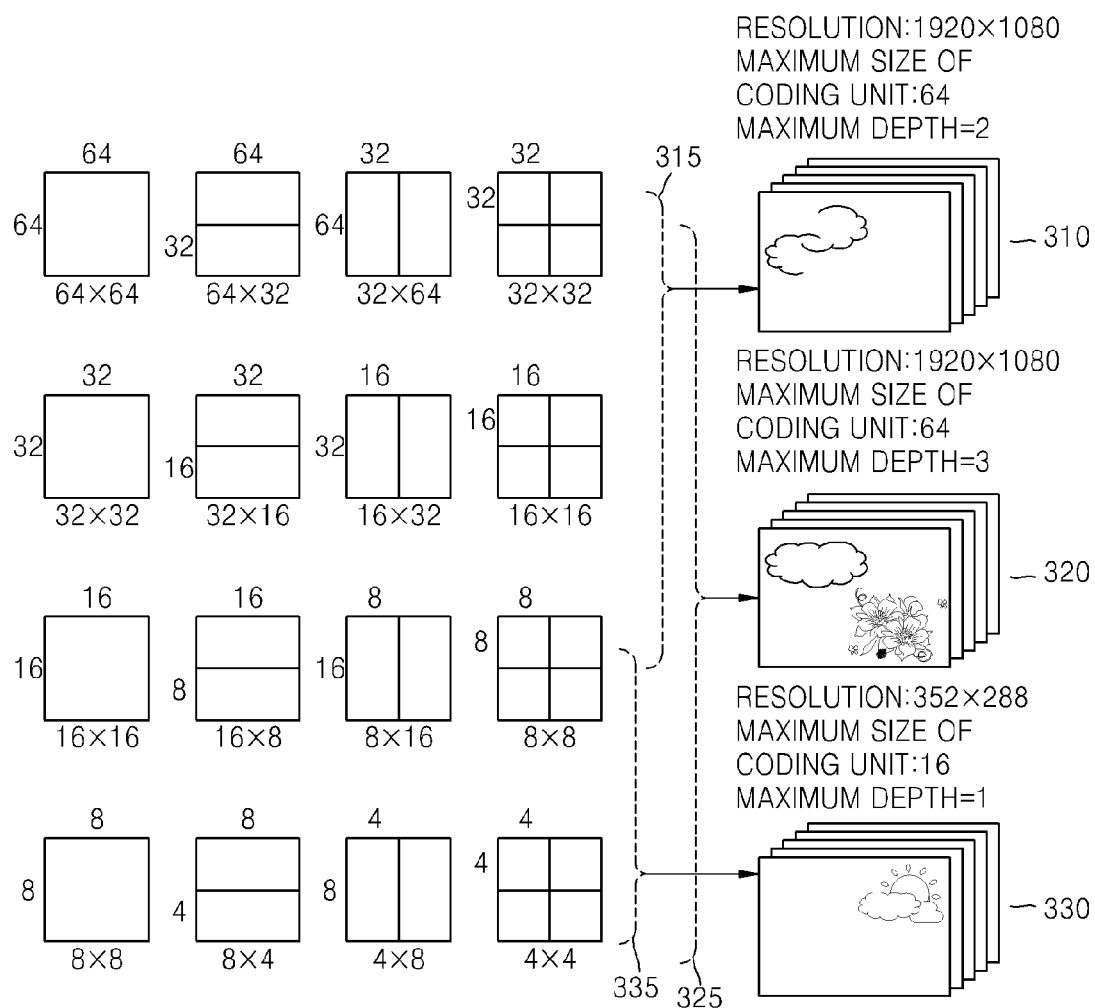
FIG. 3 is a diagram for describing a concept of coding units according to an embodiment of the present invention.

FIG. 3 is a diagram for describing a concept of coding units according to an embodiment of the present invention.

A size of a coding unit may be expressed in width×height, and may be 64×64, 32×32, 16×16, and 8×8. A coding unit of 64×64 may be split into partitions of 64×64, 64×32, 32×64, or 32×32, and a coding unit of 32×32 may be split into partitions of 32×32, 32×16, 16×32, or 16×16, a coding unit of 16×16 may be split into partitions of 16×16, 16×8, 8×16, or 8×8, and a coding unit of 8×8 may be split into partitions of 8×8, 8×4, 4×8, or 4×4.

In video data 310, a resolution is 1920×1080, a maximum size of a coding unit is 64, and a maximum depth is 2. In video data 320, a resolution is 1920×1080, a maximum size of a coding unit is 64, and a maximum depth is 3. In video data 330, a resolution is 352×288, a maximum size of a coding unit is 16, and a maximum depth is 1. The maximum depth shown in FIG. 3 denotes a total number of splits from a maximum coding unit to a minimum decoding unit.

If a resolution is high or a data amount is large, a maximum size of a coding unit may be large so as to not only increase encoding efficiency but also to accurately reflect characteristics of an image. Accordingly, the maximum size of the coding unit of the video data 310 and 320 having the higher resolution than the video data 330 may be 64.

Since the maximum depth of the video data 310 is 2, coding units 315 of the vide data 310 may include a maximum coding unit having a long axis size of 64, and coding units having long axis sizes of 32 and 16 since depths are deepened to two layers by splitting the maximum coding unit twice. Meanwhile, since the maximum depth of the video data 330 is 1, coding units 335 of the video data 330 may include a maximum coding unit having a long axis size of 16, and coding units having a long axis size of 8 since depths are deepened to one layer by splitting the maximum coding unit once.

Since the maximum depth of the video data 320 is 3, coding units 325 of the video data 320 may include a maximum coding unit having a long axis size of 64, and coding units having long axis sizes of 32, 16, and 8 since the depths are deepened to 3 layers by splitting the maximum coding unit three times. As a depth deepens, detailed information may be precisely expressed.

Figure 4:
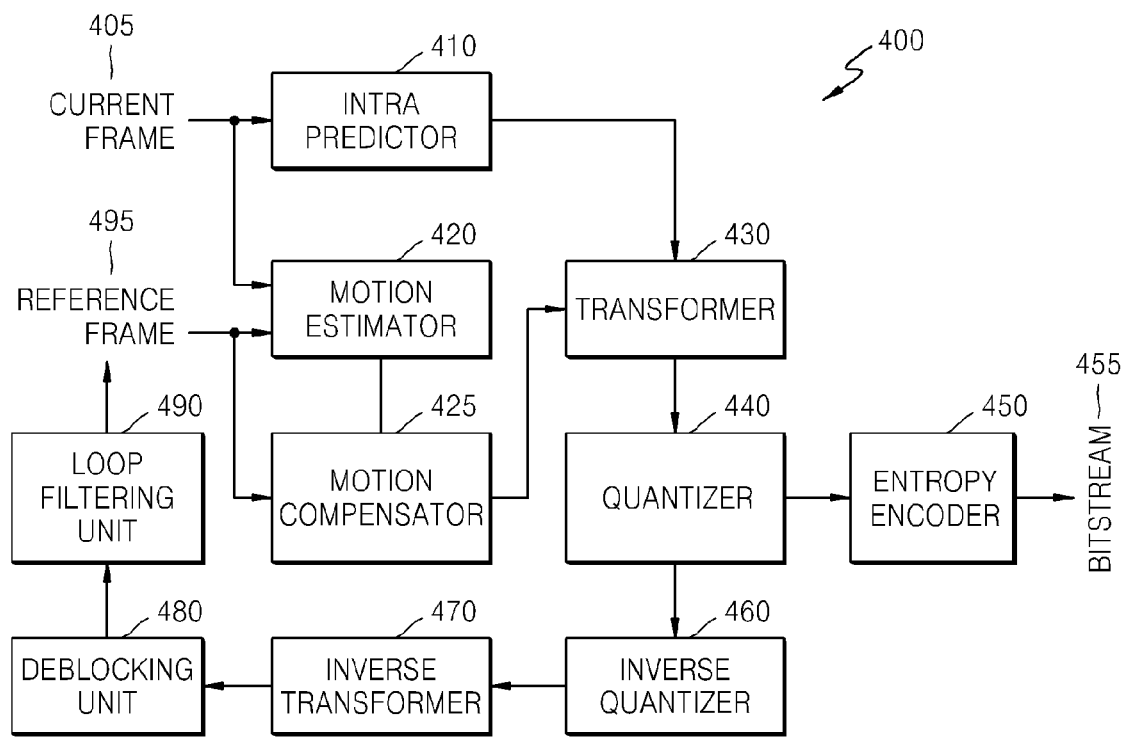
FIG. 4 is a block diagram of an image encoder based on coding units according to an embodiment of the present invention.

FIG. 4 is a block diagram of an image encoder 400 based on coding units, according to an embodiment of the present invention.

The image encoder 400 performs operations of the coding unit determiner 120 of the video encoding apparatus 100 to encode image data. In other words, an intra predictor 410 performs intra prediction on coding units in an intra mode, from among a current frame 405, and a motion estimator 420 and a motion compensator 425 performs inter estimation and motion compensation on coding units in an inter mode from among the current frame 405 by using the current frame 405, and a reference frame 495.

Data output from the intra predictor 410, the motion estimator 420, and the motion compensator 425 is output as a quantized transformation coefficient through a transformer 430 and a quantizer 440. The quantized transformation coefficient is restored as data in a spatial domain through an inverse quantizer 460 and an inverse transformer 470, and the restored data in the spatial domain is output as the reference frame 495 after being post-processed through a deblocking unit 480 and a loop filtering unit 490. The quantized transformation coefficient may be output as a bitstream 455 through an entropy encoder 450.

In order for the image encoder 400 to be applied in the video encoding apparatus 100, all elements of the image encoder 400, i.e., the intra predictor 410, the motion estimator 420, the motion compensator 425, the transformer 430, the quantizer 440, the entropy encoder 450, the inverse quantizer 460, the inverse transformer 470, the deblocking unit 480, and the loop filtering unit 490 perform operations based on each coding unit from among coding units having a tree structure while considering the maximum depth of each maximum coding unit.

Specifically, the intra predictor 410, the motion estimator 420, and the motion compensator 425 determines partitions and a prediction mode of each coding unit from among the coding units having a tree structure while considering the maximum size and the maximum depth of a current maximum coding unit, and the transformer 430 determines the size of the transformation unit in each coding unit from among the coding units having a tree structure.

Figure 5:
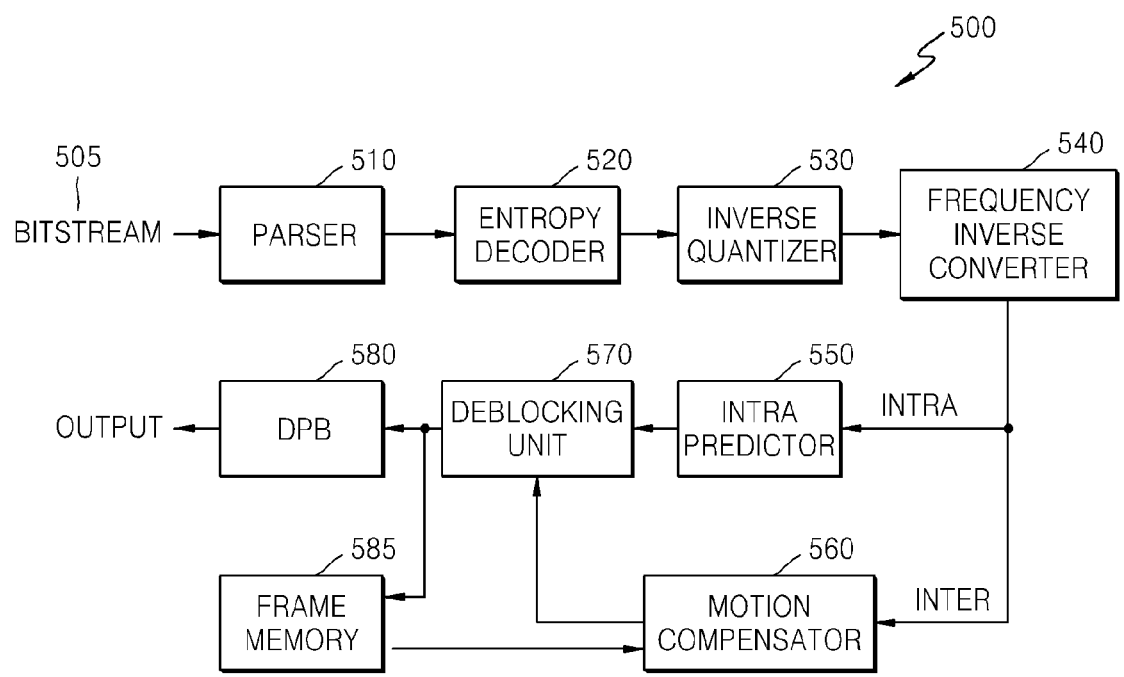
FIG. 5 is a block diagram of an image decoder based on coding units according to an embodiment of the present invention.

FIG. 5 is a block diagram of an image decoder 500 based on coding units, according to an embodiment of the present invention.

A parser 510 parses encoded image data to be decoded and information about encoding required for decoding from a bitstream 505. The encoded image data is output as inverse quantized data through the entropy decoder 520 and an inverse quantizer 530, and the inverse quantized data is restored to image data in a spatial domain through an inverse transformer 540.

An intra predictor 550 performs intra prediction on coding units in an intra mode with respect to the image data in the spatial domain, and a motion compensator 560 performs motion compensation on coding units in an inter mode by using a reference frame 585.

The data in the spatial domain which has passed through the intra predictor 550 and the motion compensator 560 may be post-processed through the deblocking unit 570 and a loop filtering unit 580 and then may be output as a restored frame 595. Also, the data that has been post-processed through the deblocking unit 570 and the loop filtering unit 580 may be output as the reference frame 585.

In order to decode the image data in the image data decoder 230 of the video decoding apparatus 200, the image decoder 500 may perform operations that are performed after the parser 510.

In order for the image decoder 500 to be applied in the video decoding apparatus 200, all elements of the image decoder 500, i.e., all of the parser 510, the entropy decoder 520, the inverse quantizer 530, the inverse transformer 540, the intra predictor 550, the motion compensator 560, the deblocking unit 570, and the loop filtering unit 580 have to perform operations based on coding units having a tree structure for each maximum coding unit.

Specifically, the intra prediction 550 and the motion compensator 560 have to determine partitions and a prediction mode for each of the coding units having a tree structure, and the inverse transformer 540 has to determine a size of a transformation unit for each coding unit.

Figure 6:
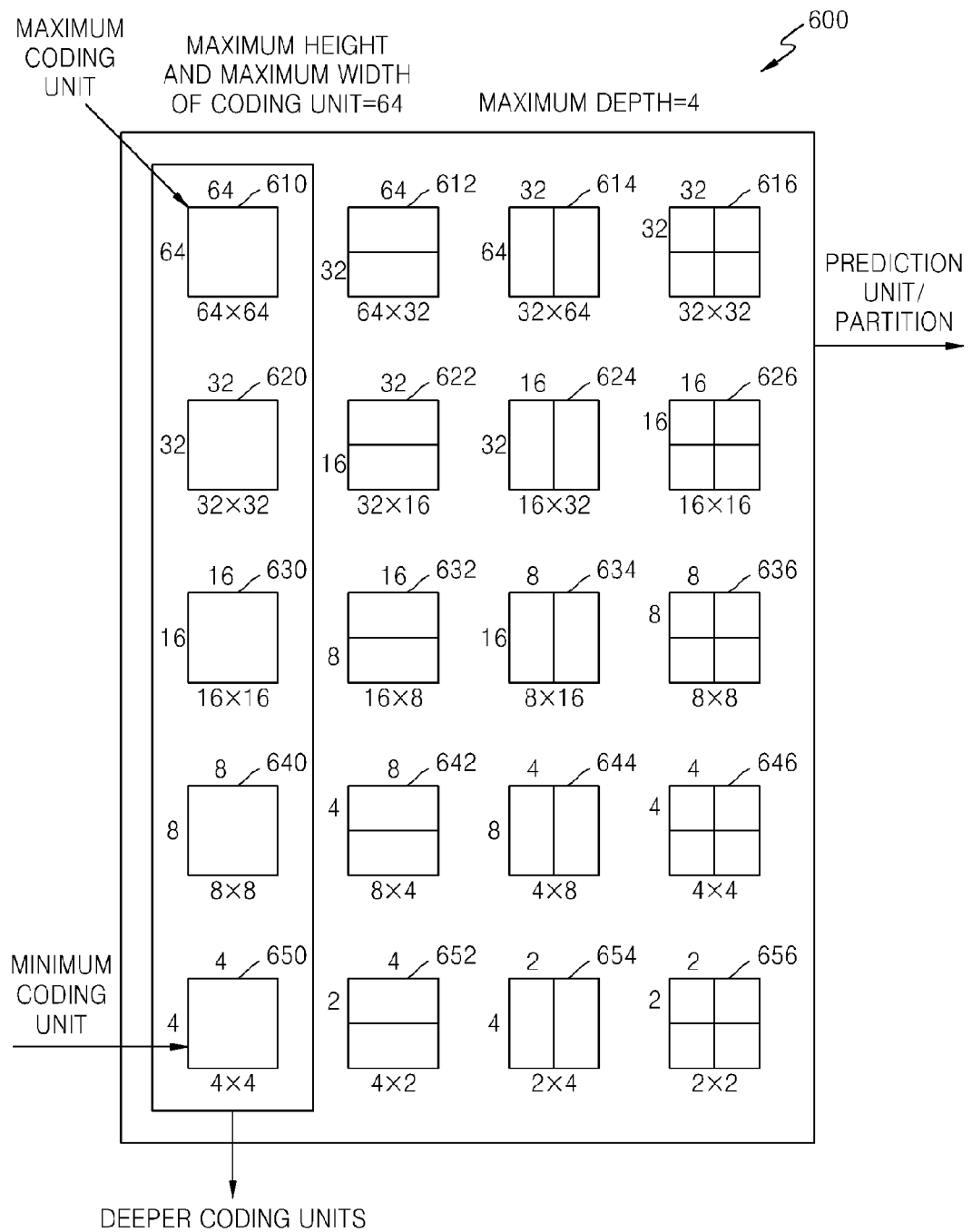
FIG. 6 is a diagram illustrating deeper coding units according to depths, and partitions according to an embodiment of the present invention.

FIG. 6 is a diagram illustrating deeper coding units according to depths, and partitions, according to an embodiment of the present invention.

The video encoding apparatus 100 and the video decoding apparatus 200 use hierarchical coding units so as to consider characteristics of an image. A maximum height, a maximum width, and a maximum depth of coding units may be adaptively determined according to the characteristics of the image, or may be differently set by a user. Sizes of deeper coding units according to depths may be determined according to the predetermined maximum size of the coding unit.

In a hierarchical structure 600 of coding units, according to an embodiment of the present invention, the maximum height and the maximum width of the coding units are each 64, and the maximum depth is 4. Since a depth deepens along a vertical axis of the hierarchical structure 600, a height and a width of the deeper coding unit are each split. Also, a prediction unit and partitions, which are bases for prediction encoding of each deeper coding unit, are shown along a horizontal axis of the hierarchical structure 600.

In other words, a coding unit 610 is a maximum coding unit in the hierarchical structure 600, wherein a depth is 0 and a size, i.e., a height by width, is 64×64. The depth deepens along the vertical axis, and a coding unit 620 having a size of 32×32 and a depth of 1, a coding unit 630 having a size of 16×16 and a depth of 2, a coding unit 640 having a size of 8×8 and a depth of 3, and a coding unit 650 having a size of 4×4 and a depth of 4 exist. The coding unit 650 having the size of 4×4 and the depth of 4 is a minimum coding unit.

The prediction unit and the partitions of a coding unit are arranged along the horizontal axis according to each depth. In other words, if the coding unit 610 having the size of 64×64 and the depth of 0 is a prediction unit, the prediction unit may be split into partitions include in the encoding unit 610, i.e. a partition 610 having a size of 64×64, partitions 612 having the size of 64×32, partitions 614 having the size of 32×64, or partitions 616 having the size of 32×32.

Similarly, a prediction unit of the coding unit 620 having the size of 32×32 and the depth of 1 may be split into partitions included in the coding unit 620, i.e. a partition 620 having a size of 32×32, partitions 622 having a size of 32×16, partitions 624 having a size of 16×32, and partitions 626 having a size of 16×16.

Similarly, a prediction unit of the coding unit 630 having the size of 16×16 and the depth of 2 may be split into partitions included in the coding unit 630, i.e. a partition having a size of 16×16 included in the coding unit 630, partitions 632 having a size of 16×8, partitions 634 having a size of 8×16, and partitions 636 having a size of 8×8.

Similarly, a prediction unit of the coding unit 640 having the size of 8×8 and the depth of 3 may be split into partitions included in the coding unit 640, i.e. a partition having a size of 8×8 included in the coding unit 640, partitions 642 having a size of 8×4, to partitions 644 having a size of 4×8, and partitions 646 having a size of 4×4.

The coding unit 650 having the size of 4×4 and the depth of 4 is the minimum coding unit and a coding unit of the lowermost depth. A prediction unit of the coding unit 650 is only assigned to a partition having a size of 4×4.

In order to determine the at least one coded depth of the coding units constituting the maximum coding unit 610, the coding unit determiner 120 of the video encoding apparatus 100 performs encoding for coding units corresponding to each depth included in the maximum coding unit 610.

A number of deeper coding units according to depths including data in the same range and the same size increases as the depth deepens. For example, four coding units corresponding to a depth of 2 are required to cover data that is included in one coding unit corresponding to a depth of 1. Accordingly, in order to compare encoding results of the same data according to depths, the coding unit corresponding to the depth of 1 and four coding units corresponding to the depth of 2 are each encoded.

In order to perform encoding for a current depth from among the depths, a least encoding error may be selected for the current depth by performing encoding for each prediction unit in the coding units corresponding to the current depth, along the horizontal axis of the hierarchical structure 600. Alternatively, the minimum encoding error may be searched for by comparing the least encoding errors according to depths, by performing encoding for each depth as the depth deepens along the vertical axis of the hierarchical structure 600. A depth and a partition having the minimum encoding error in the coding unit 610 may be selected as the coded depth and a partition type of the coding unit 610.

Figure 7:
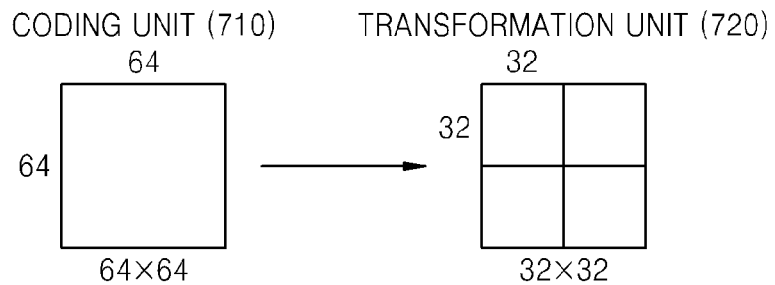
FIG. 7 is a diagram for describing a relationship between a coding unit and transformation units, according to an embodiment of the present invention.

FIG. 7 is a diagram for describing a relationship between a coding unit 710 and transformation units 720, according to an embodiment of the present invention.

The video encoding apparatus 100 or 200 encodes or decodes an image according to coding units having sizes smaller than or equal to a maximum coding unit for each maximum coding unit. Sizes of transformation units for transformation during encoding may be selected based on data units that are not larger than a corresponding coding unit.

For example, in the video encoding apparatus 100 or 200, if a size of the coding unit 710 is 64×64, transformation may be performed by using the transformation units 720 having a size of 32×32.

Also, data of the coding unit 710 having the size of 64×64 may be encoded by performing the transformation on each of the transformation units having the size of 32×32, 16×16, 8×8, and 4×4, which are smaller than 64×64, and then a transformation unit having the least coding error may be selected.

Figure 8:
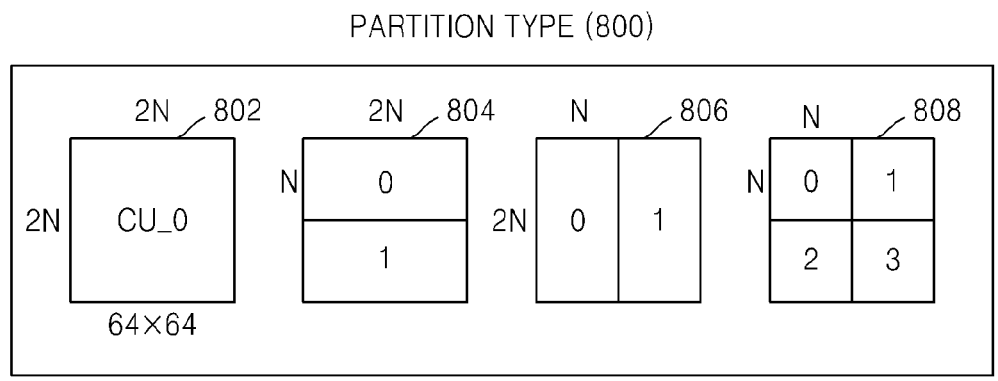
FIG. 8 is a diagram for describing encoding information of coding units corresponding to a coded depth, according to an embodiment of the present invention.
Figure 8:
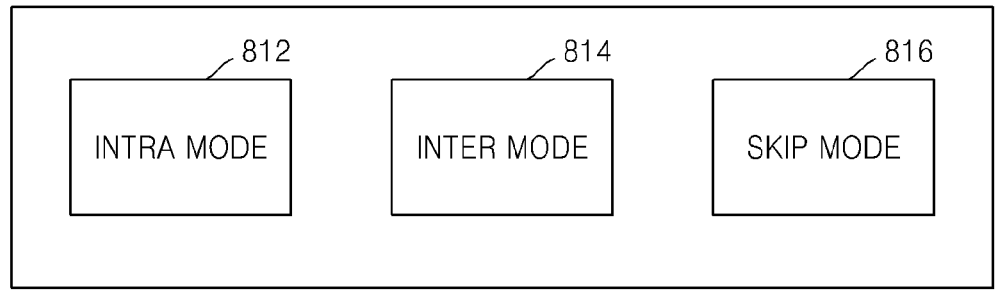
Figure 8:
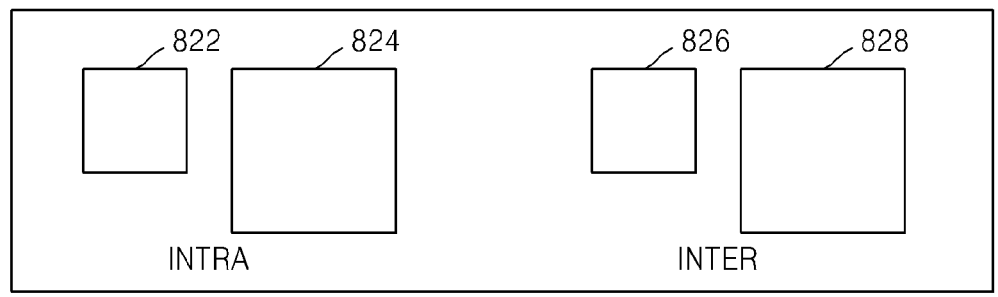

FIG. 8 is a diagram for describing encoding information of coding units corresponding to a coded depth, according to an embodiment of the present invention.

The output unit 130 of the video encoding apparatus 100 may encode and transmit information 800 about a partition type, information 810 about a prediction mode, and information 820 about a size of a transformation unit for each coding unit corresponding to a coded depth, as information about an encoding mode.

The information 800 indicates information about a shape of a partition obtained by splitting a prediction unit of a current coding unit, wherein the partition is a data unit for prediction encoding the current coding unit. For example, a current coding unit CU_0 having a size of 2N×2N may be split into any one of a partition 802 having a size of 2N×2N, a partition 804 having a size of 2N×N, a partition 806 having a size of N×2N, and a partition 808 having a size of N×N. Here, the information 800 about a partition type is set to indicate one of the partition 804 having a size of 2N×N, the partition 806 having a size of N×2N, and the partition 808 having a size of N×N The information 810 indicates a prediction mode of each partition. For example, the information 810 may indicate a mode of prediction encoding performed on a partition indicated by the information 800, i.e., an intra mode 812, an inter mode 814, or a skip mode 816.

The information 820 indicates a transformation unit to be based on when transformation is performed on a current coding unit. For example, the transformation unit may be a first intra transformation unit 822, a second intra transformation unit 824, a first inter transformation unit 826, or a second intra transformation unit 828.

Figure 9:
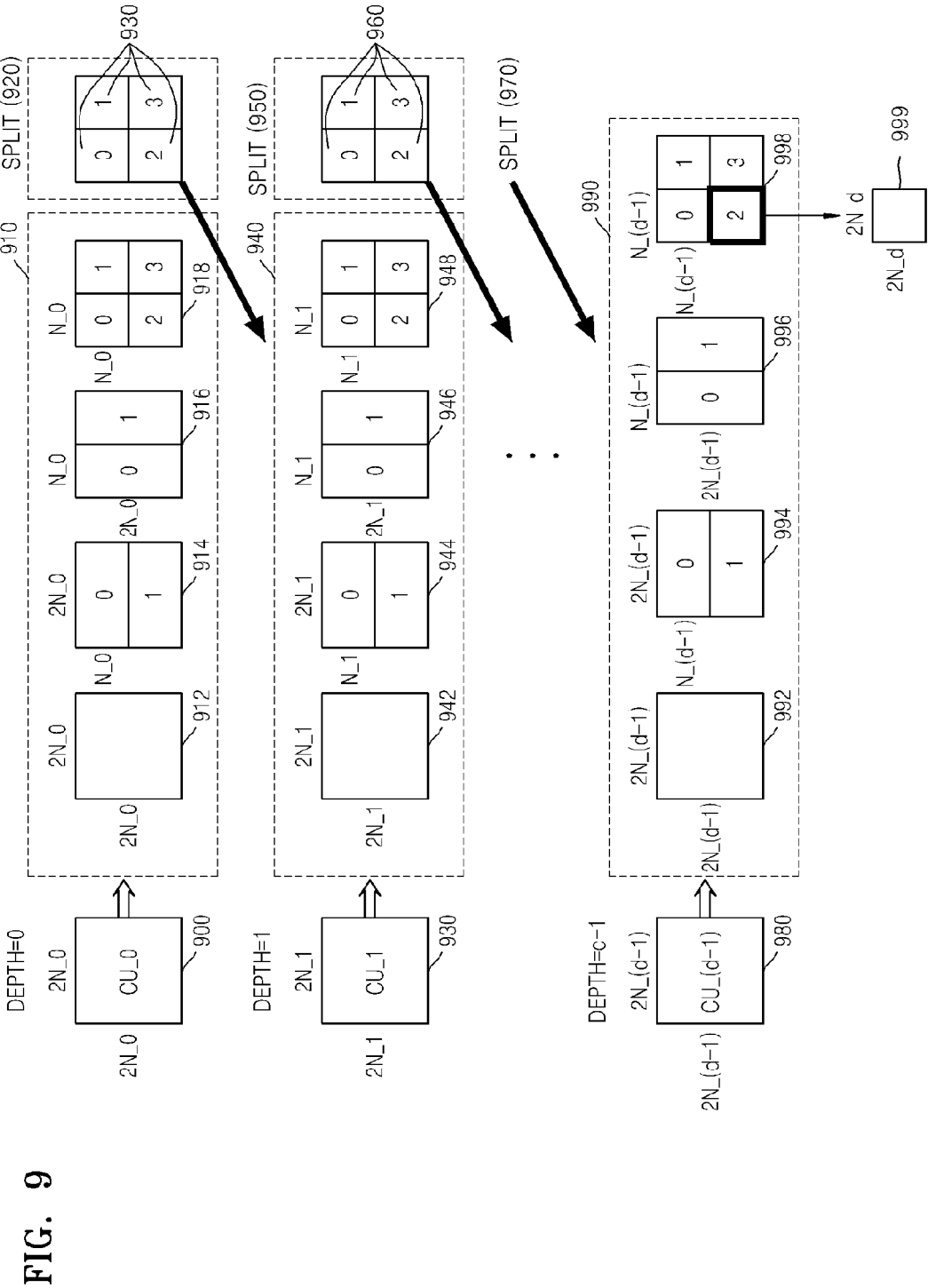
FIG. 9 is a diagram of deeper coding units according to depths, according to an embodiment of the present invention.

The image data and encoding information extractor 220 of the video decoding apparatus 200 may extract and use the information 800, 810, and 820 for decoding, according to each deeper coding unit FIG. 9 is a diagram of deeper coding units according to depths, according to an embodiment of the present invention.

Split information may be used to indicate a change of a depth. The spilt information indicates whether a coding unit of a current depth is split into coding units of a lower depth.

A prediction unit 910 for prediction encoding a coding unit 900 having a depth of 0 and a size of 2N_0×2N_0 may include partitions of a partition type 912 having a size of 2N_0×2N_0, a partition type 914 having a size of 2N_0×N_0, a partition type 916 having a size of N_0×2N_0, and a partition type 918 having a size of N_0×N_0. FIG. 9 only illustrates the partition types 912 through 918 which are obtained by symmetrically splitting the prediction unit 910, but a partition type is not limited thereto, and the partitions of the prediction unit 910 may include asymmetrical partitions, partitions having a predetermined shape, and partitions having a geometrical shape.

Prediction encoding is repeatedly performed on one partition having a size of 2N_0×2N_0, two partitions having a size of 2N_0×N_0, two partitions having a size of N_0×2N_0, and four partitions having a size of N_0×N_0, according to each partition type. The prediction encoding in an intra mode and an inter mode may be performed on the partitions having the sizes of 2N_0×2N_0, N_0×2N_0, 2N_0×N_0, and N_0×N_0. The prediction encoding in a skip mode is performed only on the partition having the size of 2N_0×2N_0.

Errors of encoding including the prediction encoding in the partition types 912 through 918 are compared, and the least encoding error is determined among the partition types. If an encoding error is smallest in one of the partition types 912 through 916, the prediction unit 910 may not be split into a lower depth.

If the encoding error is the smallest in the partition type 918, a depth is changed from 0 to 1 to split the partition type 918 in operation 920, and encoding is repeatedly performed on coding units 930 having a depth of 2 and a size of N_0×N_0 to search for a minimum encoding error.

A prediction unit 940 for prediction encoding the coding unit 930 having a depth of 1 and a size of 2N_1×2N_1 (=N_0×N_0) may include partitions of a partition type 942 having a size of 2N_1×2N_1, a partition type 944 having a size of 2N_1×N_1, a partition type 946 having a size of N_1×2N_1, and a partition type 948 having a size of N_1N_1.

If an encoding error is the smallest in the partition type 948, a depth is changed from 1 to 2 to split the partition type 948 in operation 950, and encoding is repeatedly performed on coding units 960, which have a depth of 2 and a size of N_2N_2 to search for a minimum encoding error.

When a maximum depth is d, split operation according to each depth may be performed up to when a depth becomes d-1, and split information may be encoded as up to when a depth is one of 0 to d-2. In other words, when encoding is performed up to when the depth is d-1 after a coding unit corresponding to a depth of d-2 is split in operation 970, a prediction unit 990 for prediction encoding a coding unit 980 having a depth of d-1 and a size of 2N_(d-1)×2N_(d-1) may include partitions of a partition type 992 having a size of 2N_(d-1)×2N_(d-1), a partition type 994 having a size of 2N_(d-1)×N_(d-1), a partition type 996 having a size of N_(d-1)×2N_(d-1), and a partition type 998 having a size of N_(d-1)×N_(d-1).

Prediction encoding may be repeatedly performed on one partition having a size of 2N_(d-1)×2N_(d-1), two partitions having a size of 2N (d-1)×N_(d-1), two partitions having a size of N_(d-1)×2N_(d-1), four partitions having a size of N_(d-1)×N_(d-1) from among the partition types 992 through 998 to search for a partition type having a minimum encoding error.

Even when the partition type 998 has the minimum encoding error, since a maximum depth is d, a coding unit CU_(d-1) having a depth of d-1 is no longer split to a lower depth, and a coded depth for the coding units constituting a current maximum coding unit 900 is determined to be d-1 and a partition type of the current maximum coding unit 900 may be determined to be N_(d-1)×N_(d-1). Also, since the maximum depth is d and a minimum coding unit 980 having a lowermost depth of d-1 is no longer split to a lower depth, split information for the minimum coding unit 980 is not set.

A data unit 999 may be a 'minimum unit' for the current maximum coding unit. A minimum unit according to an embodiment of the present invention may be a rectangular data unit obtained by splitting a minimum coding unit 980 by 4. By performing the encoding repeatedly, the video encoding apparatus 100 may select a depth having the least encoding error by comparing encoding errors according to depths of the coding unit 900 to determine a coded depth, and set a corresponding partition type and a prediction mode as an encoding mode of the coded depth.

As such, the minimum encoding errors according to depths are compared in all of the depths of 1 through d, and a depth having the least encoding error may be determined as a coded depth. The coded depth, the partition type of the prediction unit, and the prediction mode may be encoded and transmitted as information about an encoding mode. Also, since a coding unit is split from a depth of 0 to a coded depth, only split information of the coded depth is set to 0, and split information of depths excluding the coded depth is set to 1.

The image data and encoding information extractor 220 of the video decoding apparatus 200 may extract and use the information about the coded depth and the prediction unit of the coding unit 900 to decode the partition 912. The video decoding apparatus 200 may determine a depth, in which split information is 0, as a coded depth by using split information according to depths, and use information about an encoding mode of the corresponding depth for decoding.

The prediction units 1060 are partitions of prediction units of each of the coding units 1010, and the transformation units 1070 are transformation units of each of the coding units 1010.

When a depth of a maximum coding unit is 0 in the coding units 1010, depths of coding units 1012 and 1054 are 1, depths of coding units 1014, 1016, 1018, 1028, 1050, and 1052 are 2, depths of coding units 1020, 1022, 1024, 1026, 1030, 1032, and 1048 are 3, and depths of coding units 1040, 1042, 1044, and 1046 are 4.

In the prediction units 1060, some encoding units 1014, 1016, 1022, 1032, 1048, 1050, 1052, and 1054 are obtained by splitting the coding units in the encoding units 1010. In other words, partition types in the coding units 1014, 1022, 1050, and 1054 have a size of 2N×N, partition types in the coding units 1016, 1048, and 1052 have a size of N×2N, and a partition type of the coding unit 1032 has a size of N×N. Prediction units and partitions of the coding units 1010 are smaller than or equal to each coding unit.

Transformation or inverse transformation is performed on image data of the coding unit 1052 in the transformation units 1070 in a data unit that is smaller than the coding unit 1052. Also, the coding units 1014, 1016, 1022, 1032, 1048, 1050, and 1052 in the transformation units 1070 are different from those in the prediction units 1060 in terms of sizes and shapes. In other words, the video encoding and decoding apparatuses 100 and 200 may perform intra prediction, motion estimation, motion compensation, transformation, and inverse transformation individually on a data unit in the same coding unit.

Accordingly, encoding is recursively performed on each of coding units having a hierarchical structure in each region of a maximum coding unit to determine an optimum coding unit, and thus coding units having a recursive tree structure may be obtained. Encoding information may include split information about a coding unit, information about a partition type, information about a prediction mode, and information about a size of a transformation unit. Table 1 shows the encoding information that may be set by the video encoding and decoding apparatuses 100 and 200.

TABLE 1

| | | Split Information 0 (Encoding on Coding Unit having Size of 2N × 2N and Current Depth of d) | | | | Split Information 1 |
|---|---|---|---|---|---|---|
| | | Partition Type | | Size of Transformation Unit | | |
| Prediction Mode | Symmetrical Partition Type | Asymmetrical Partition Type | Split Information 0 of Transformation Unit | Split Information 1 of Transformation Unit | | |
| Intra Inter Skip (Only 2N × 2N) | 2N × 2N 2N × N N × 2N N × N | 2N × nU 2N × nD nL × 2N nR × 2N | 2N × 2N | N × N (Symmetrical Type) N/2 × N/2 (Asymmetrical Type) | Repeatedly Encode Coding Units having Lower Depth of d + 1 | |

Figure 10:
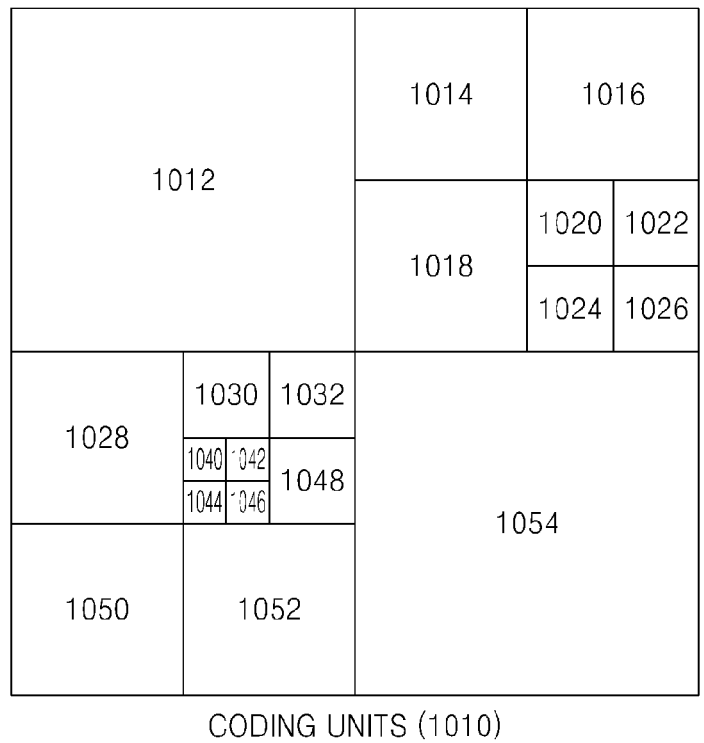
FIGS. 10 through 12 are diagrams for describing a relationship between coding units, prediction units, and transformation units, according to an embodiment of the present invention.
Figure 11:
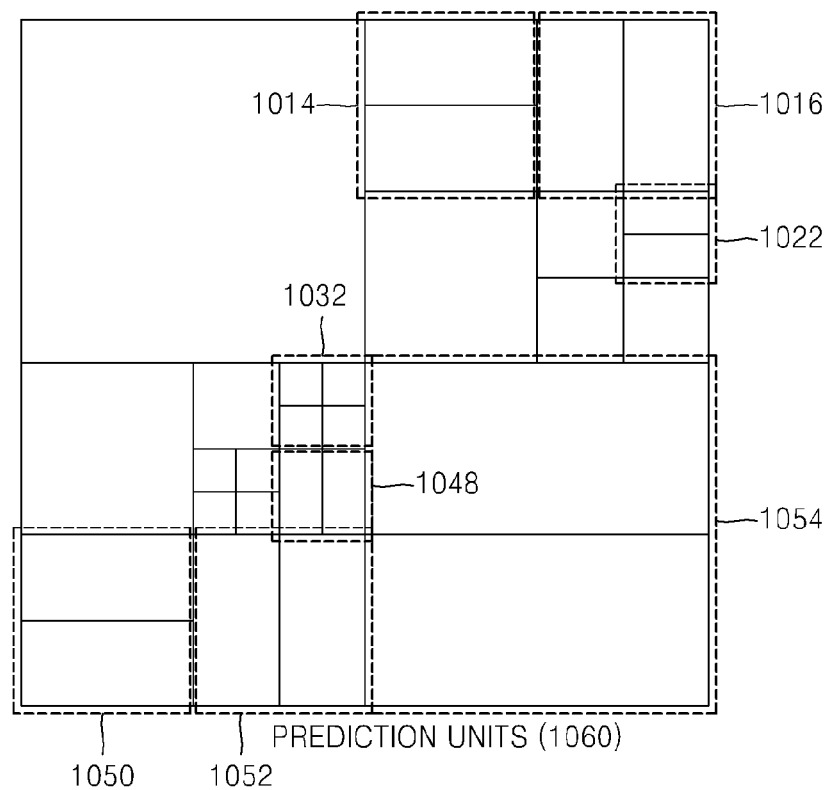
Figure 12:
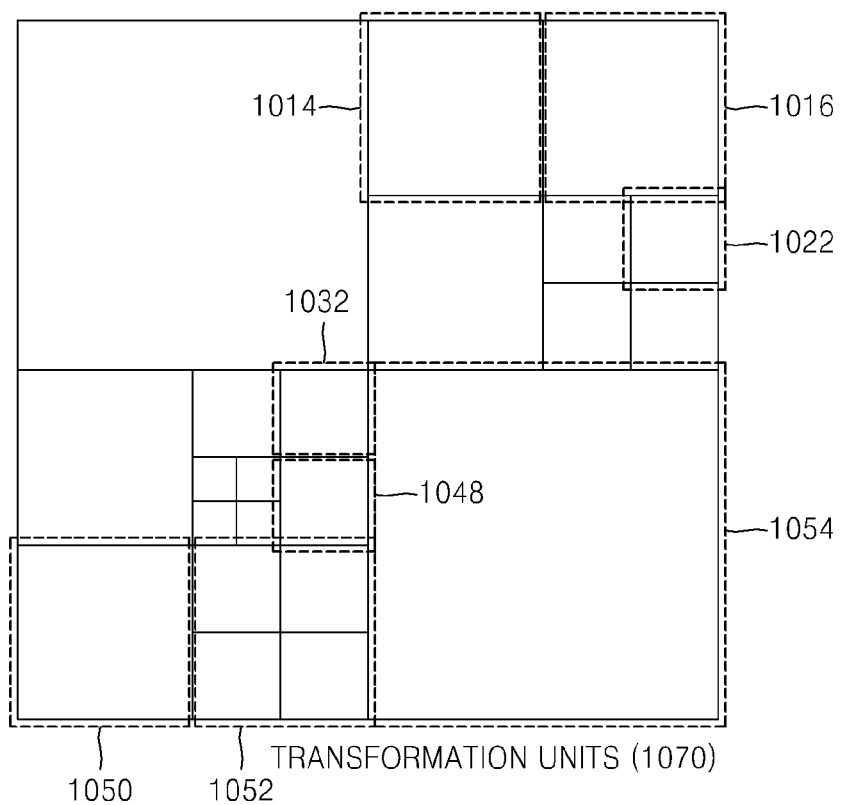

FIGS. 10 through 12 are diagrams for describing a relationship between coding units 1010, prediction units 1060, and transformation units 1070, according to an embodiment of the present invention.

The coding units 1010 are coding units having a tree structure, corresponding to coded depths determined by the video encoding apparatus 100, in a maximum coding unit.

The output unit 130 of the video encoding apparatus 100 may output the encoding information about the coding units having a tree structure, and the image data and encoding information extractor 220 of the video decoding apparatus 200 may extract the encoding information about the coding units having a tree structure from a received bitstream.

Split information indicates whether a current coding unit is split into coding units of a lower depth. If split information of a current depth d is 0, a depth, in which a current coding unit is no longer split into a lower depth, is a coded depth, and thus information about a partition type, prediction mode, and a size of a transformation unit may be defined for the coded depth. If the current coding unit is further split according to the split information, encoding is independently performed on four split coding units of a lower depth.

A prediction mode may be one of an intra mode, an inter mode, and a skip mode. The intra mode and the inter mode may be defined in all partition types, and the skip mode is defined only in a partition type having a size of 2N×2N.

The information about the partition type may indicate symmetrical partition types having sizes of 2N×2N, 2N×N, N×2N, and N×N, which are obtained by symmetrically splitting a height or a width of a prediction unit, and asymmetrical partition types having sizes of 2N×nU, 2N×nD, nL×2N, and nR×2N, which are obtained by asymmetrically splitting the height or width of the prediction unit. The asymmetrical partition types having the sizes of 2N×nU and 2N×nD may be respectively obtained by splitting the height of the prediction unit in 1:3 and 3:1, and the asymmetrical partition types having the sizes of nL×2N and nR×2N may be respectively obtained by splitting the width of the prediction unit in 1:3 and 3:1

The size of the transformation unit may be set to be two types in the intra mode and two types in the inter mode. In other words, if split information of the transformation unit is 0, the size of the transformation unit may be 2N×2N, which is the size of the current coding unit. If split information of the transformation unit is 1, the transformation units may be obtained by splitting the current coding unit. Also, if a partition type of the current coding unit having the size of 2N×2N is a symmetrical partition type, a size of a transformation unit may be N×N, and if the partition type of the current coding unit is an asymmetrical partition type, the size of the transformation unit may be N/2×N/2.

The encoding information about coding units having a tree structure may include at least one of a coding unit corresponding to a coded depth, a prediction unit, and a minimum unit. The coding unit corresponding to the coded depth may include at least one of a prediction unit and a minimum unit containing the same encoding information.

Accordingly, it is determined whether adjacent data units are included in the same coding unit corresponding to the coded depth by comparing encoding information of the adjacent data units. Also, a corresponding coding unit corresponding to a coded depth is determined by using encoding information of a data unit, and thus a distribution of coded depths in a maximum coding unit may be determined.

Accordingly, if a current coding unit is predicted based on encoding information of adjacent data units, encoding information of data units in deeper coding units adjacent to the current coding unit may be directly referred to and used.

Alternatively, if a current coding unit is predicted based on encoding information of adjacent data units, data units adjacent to the current coding unit are searched using encoded information of the data units, and the searched adjacent coding units may be referred for predicting the current coding unit.

Figure 13:
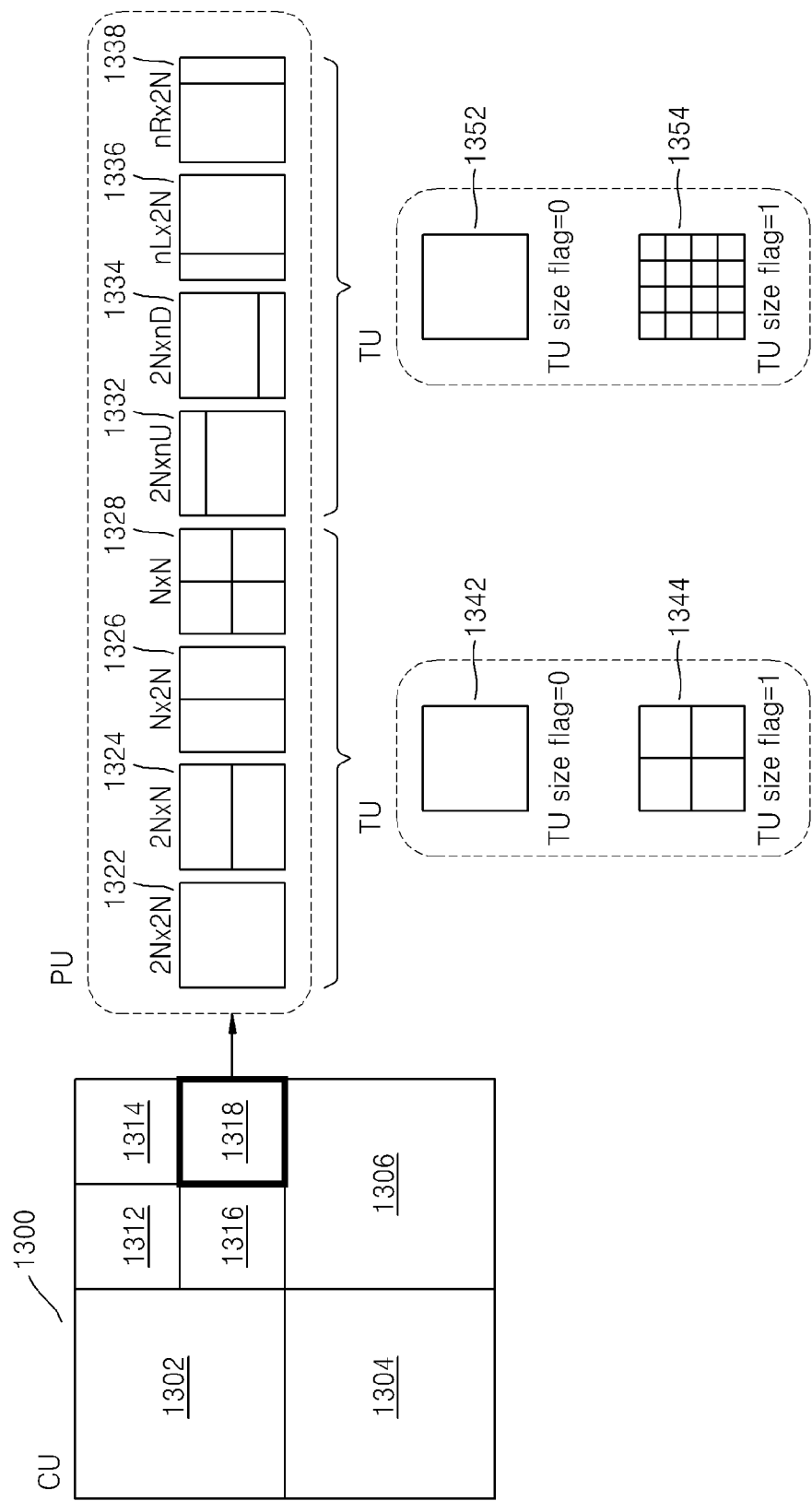
FIG. 13 is a diagram for describing a relationship between a coding unit, a prediction unit or a partition, and a transformation unit, according to encoding mode information of Table 1.

FIG. 13 is a diagram for describing a relationship between a coding unit, a prediction unit or a partition, and a transformation unit, according to encoding mode information of Table 1.

A maximum coding unit 1300 includes coding units 1302, 1304, 1306, 1312, 1314, 1316, and 1318 of coded depths.

Here, since the coding unit 1318 is a coding unit of a coded depth, split information may be set to 0. Information about a partition type of the coding unit 1318 having a size of 2N×2N may be set to be one of a partition type 1322 having a size of 2N×2N, a partition type 1324 having a size of 2N×N, a partition type 1326 having a size of N×2N, a partition type 1328 having a size of N×N, a partition type 1332 having a size of 2N×nU, a partition type 1334 having a size of 2N×nD, a partition type 1336 having a size of nL×2N, and a partition type 1338 having a size of nR×2N.

When the partition type is set to be symmetrical, i.e. the partition type 1322, 1324, 1326, or 1328, a transformation unit 1342 having a size of 2N×2N is set if split information (TU size flag) of a transformation unit is 0, and a transformation unit 1344 having a size of N×N is set if a TU size flag is 1.

When the partition type is set to be asymmetrical, i.e., the partition type 1332, 1334, 1336, or 1338, a transformation unit 1352 having a size of 2N×2N is set if a TU size flag is 0, and a transformation unit 1354 having a size of N/2×N/2 is set if a TU size flag is 1.

Hereinafter, entropy encoding and decoding processes performed by the entropy encoder 450 of the image encoder 400 in FIG. 4 and the entropy decoder 520 of the image decoder 500 in FIG. 5 are described in detail.

As described above, the image encoder 400 according to the embodiment of the present invention performs encoding by using a coding unit obtained by hierarchically splitting a maximum coding unit. The entropy encoder 450 entropy-encodes a plurality of pieces of encoding information, e.g., syntax elements SE such as a quantized transformation coefficient, a prediction mode of a prediction unit, a quantization parameter, a motion vector, etc. that are generated for each coding unit. In more detail, the entropy encoder 450 performs Context-Based Binary Arithmetic Coding (CABAC) on the syntax elements.

Figure 14:
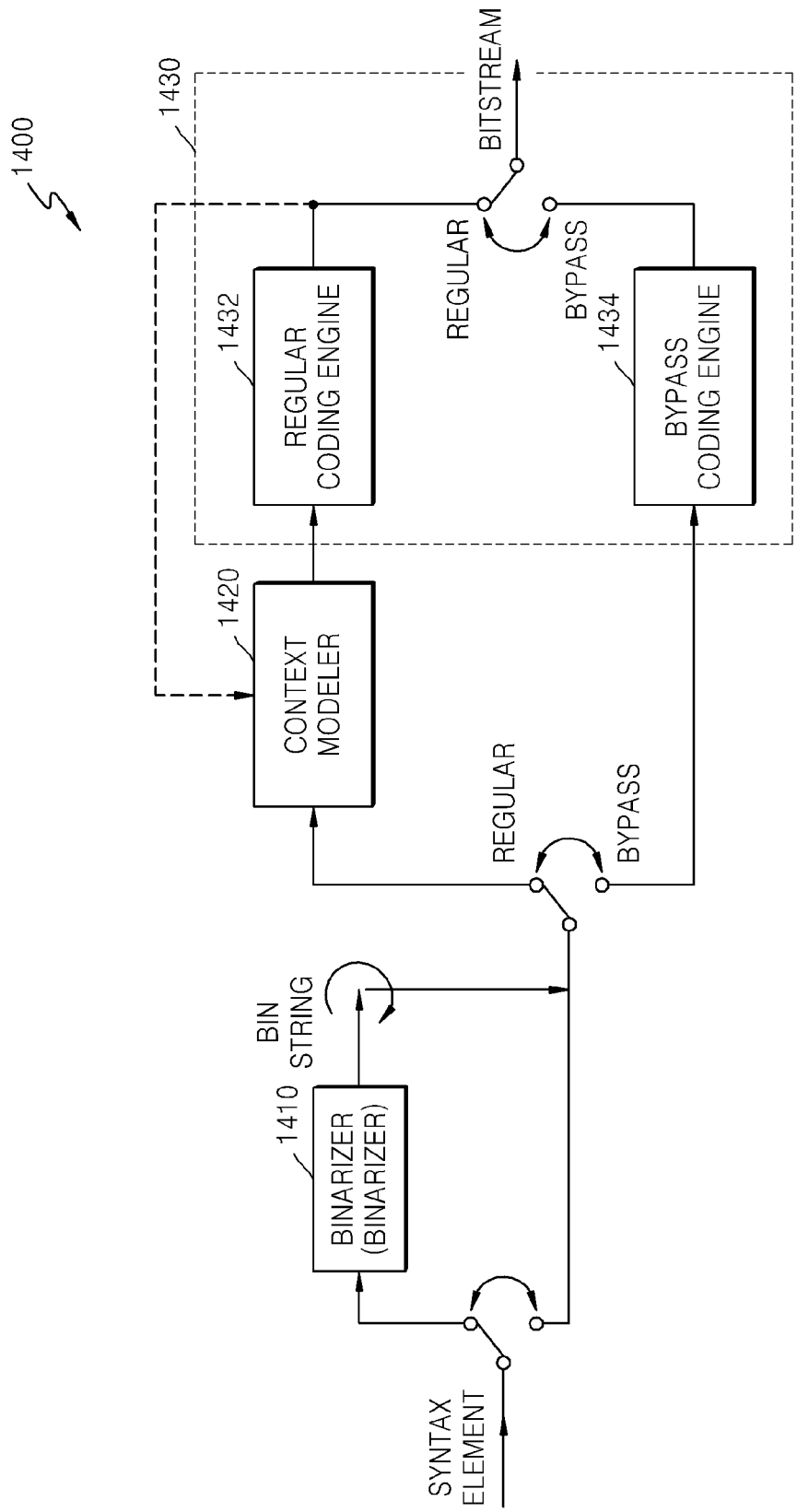
FIG. 14 is a block diagram illustrating a configuration of an entropy encoding apparatus, according to an embodiment of the present invention.

FIG. 14 is a block diagram illustrating a configuration of an entropy encoding apparatus 1400, according to an embodiment of the present invention.

Referring to FIG. 14, the entropy encoding apparatus 1400 includes a binarizer 1410, a context modeler 1420, and a binary arithmetic coder 1430. Also, the binary arithmetic coder 1430 includes a regular coding engine 1432 and a bypass coding engine 1434.

Syntax elements that are input to the entropy encoding apparatus 1400 may not be binary values, and thus, when the syntax elements are not the binary values, the binarizer 1410 binarizes the syntax elements and then outputs a bin string configured of binary values of 0 or 1. A bin indicates each bit of the string configured of 0 or 1, and each bin is encoded via CABAC. When the syntax element is the data having the same occurrences of 0 and 1, the syntax element is output to the bypass coding engine 1434 that does not use a probability value and then is encoded.

The context modeler 1420 provides a probability model with respect to a current coding symbol to the regular coding engine 1432. In more detail, the context modeler 1420 determines a probability of a predetermined binary value, based on previously-coded symbols, and outputs to the binary arithmetic coder 1430 an occurrence probability of a binary value for encoding a binary value of the current coding symbol. A conventional context modeler such as H.264/AVC, etc. provides a probability model with respect to a coding symbol via an occurrence probability of a most probable symbol (MPS) and a context index ctxIdx that is information indicating which binary value from among 0 and 1 corresponds to the MPS. On the other hand, the context modeler 1420 according to the present embodiment does not distinguish between an MPS and a least probable symbol (LPS) but determines P(1) indicating an occurrence probability of a predefined binary value, e.g., "1", based on a previously-coded symbol, and provides a determined probability of the predefined binary value to the binary arithmetic coder 1430.

The context modeler 1420 updates the probability of the predefined binary value by using a plurality of scaling factors, depending on the binary value of the current coding symbol. The updating of the probability of the predefined binary value will be described in detail later.

The regular coding engine 1432 performs binary arithmetic coding, based on the probability of the predefined binary value and the binary value of the current coding symbol which are provided from the context modeler 1420. That is, the regular coding engine 1432 may determine the occurrence probability P(1) of "1" and an occurrence probability P(0) of "0", based on the probability of the predefined binary value provided from the context modeler 1420, changes a range indicating a probability range according to the binary value of the current coding symbol, based on the determined occurrence probabilities P(0) and P(1) of 0 and 1, and thus performs the binary arithmetic coding.

Figure 15:
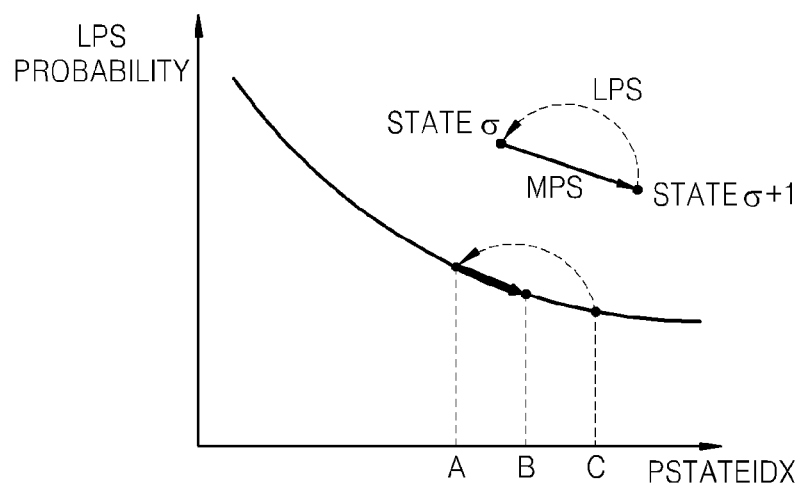
FIG. 15 illustrates an update process for an occurrence probability which is performed in a technical field related to the present invention.

FIG. 15 illustrates an update process for an occurrence probability which is performed in a technical field related to the present invention.

Referring to FIG. 15, according to the conventional H.264/AVC, etc, when a probability state index pStateIdx in a probability function is determined, if a value of a coding symbol is a designated value as an MPS, the probability state index pStateIdx is updated so that a probability state is shifted to a front-directional state, state a+1, in which an LPS probability is decreased from a current probability state, state a, and if the value of the coding symbol is not the MPS, i.e., if the value is designated as an LPS, the probability state index pStateIdx is updated so that the probability state is shifted to a rear-directional state, state σ-k(k>0), in which the LPS probability is increased from the current probability state, state σ. For example, when the probability state index pStateIdx is currently C, if a value of a current coding symbol is designated as an LPS, the current coding symbol is encoded and the probability state index pStateIdx is updated to A. When a value of a next coding symbol is designated as an LPS, the probability state index pStateIdx is updated again from A to B.

As illustrated, the conventional probability function has an exponential form. In the probability function with the exponential form, a probability distribution of an LPS close to 0 is very dense, and a probability distribution of an LPS close to ½ is very sparse. Thus, if based on the probability function with the exponential form, when occurrence probabilities of binary values of 0 and 1 are similar, i.e., when the occurrence probabilities of the binary values of 0 and 1 are close to ½, a probability is sparsely distributed such that a prediction error of the probability may be increased. Also, when the probability function with the exponential form is used, probability values close to 0 have to be finely expressed such that bit depths to indicate the probability values may be increased. Thus, a size of a look-up table for storing a probability model having the probability function with the exponential form may be increased. Also, according to the related art, when the probability is updated or a probability range is partitioned, if dense probability values are used, the amount of multiplication calculation is increased while a large load is applied to hardware.

According to the present embodiment, the context modeler 1420 determines occurrence probabilities of binary values of 0 and 1, based on a probability function having a uniform distribution. Also, the context modeler 1420 updates a probability of a predetermined binary value by using a plurality of scaling factors.

Hereinafter, the update process for the probability model which is performed by the context modeler 1420 will be described in detail.

In the CABAC, a probability update is performed by using Equation 1 below.

$$P\_new = a*y + (1-a)*P\_old \quad [\text{Equation 1}]$$

In Equation 1, P_new indicates a probability of an updated LPS, P_old indicates a probability of an LPS that is used in arithmetically coding a current coding symbol, and a (where a is an real number that satisfies a<1) is a scaling factor. When the number of previously-coded symbols is N (where N is an integer value), a=1/N may be possible. y has a value of 0 when the current coding symbol has a binary value corresponding to a value of an MPS, and has a value of 1 when the current coding symbol has a binary value corresponding to a value of an LPS.

In the probability update based on Equation 1, an important parameter is a, which is the scaling factor. Depending on a value of the scaling factor a, sensitiveness of a reaction of an entire CABAC coding procedure, and stability with respect to the entire CABAC coding procedure not reacting to noise or an error are determined. A procedure of determining a value of an appropriate scaling factor a is difficult and time consuming.

Thus, in a probability update, the context modeler 1420 according to the present embodiment generates a plurality of updated probabilities by using a plurality of scaling factors ai, and determines a final updated probability by using a weighted average of the plurality of updated probabilities.

In more detail, the context modeler 1420 generates the plurality of updated probabilities, according to Equation 2 below using the plurality of scaling factors ai.

$$P_i\_new = a_i*y + (1-a_i)*P\_old \quad [\text{Equation 2}]$$

In Equation 2, Pi_new indicates a probability of a predetermined binary value updated by using a scaling factor ai, and P_old indicates a probability of a predetermined binary value used in arithmetically coding a current coding symbol. In Equation 2, Pi_new or P_old indicates a predefined binary value, i.e., an occurrence probability of 0 or 1. That is, in the present embodiment, a probability does not indicate an MPS and an LPS but indicates an occurrence probability of a specific binary value, e.g., "1". Hereinafter, it is assumed that the predetermined binary value is 1, i.e., Pi_new or P_old indicates an occurrence probability of "1". However, it is not limited thereto and thus the probability update according to the present embodiment may be similarly applied to a case in which Pi_new or P_old indicates an occurrence probability of "0".

When a plurality of probabilities Pi_new are obtained by using Equation 2, the context modeler 1420 calculates a weighted average value of the plurality of probabilities Pi_new by using Equation 3.

$$p = \Sigma \beta_i * P_i\_new \quad [\text{Equation 3}]$$

βi is a weight to be multiplied to the plurality of probabilities Pi_new, and may be set so that the weighted average value may be calculated in consideration of the number of all probabilities Pi_new.

According to the present embodiment, in order to skip a multiplication process in the probability update, values of an exponentiation of 2 may be used as the probability.

It is assumed that a probability pi has a value obtained from Equation; $pi=Ai/(2^k)$, by using integers Ai from 0 through $2^k$ (where k is an integer). Also, it is assumed that a plurality of scaling factors ai have values obtained from Equation, $ai=1/(2^{Mi})$ (where Mi is an integer), by using the values of the exponentiation of 2. In this case, Equation 2 may be changed to Equation 4 below where a shift calculation is used.

$$P_i\_new=(Y>>M_i)+P\_old-(P\_old>>M_i)$$

As described above, the probability according to the present embodiment indicates a probability of a predetermined binary value, e.g., P_old means a probability in which a last coding symbol has a value of 1, and Pi_new means a probability in which a next coding symbol has a value of 1 and which is obtained by updating P_old. When the predetermined binary value is "1" in Equation 4, if the last coding symbol is "1", Y has a value of $2^k$ (where k is an integer), and if the last coding symbol is "0", Y has a value of 0. A calculation ">>Mi" performs a rightward shift by an Mi bit, and in this regard, a value of Mi may have one of {3,4,5,6,7,8}. As described above, because the scaling factor ai corresponds to $ai=1/(2^{Mi})$, if one of {3,4,5,6,7,8} is used as the value of Mi, ai corresponds to {8, 16, 32, 64, 128, 256}. Also, when the number of previously-coded symbols is Ni (where Ni is an integer), $ai=1/Ni$ may be set. Thus, $Ni=1/ai \in \{8, 16, 32, 64, 128, 256\}$ is established. Ni may be referred to as a window size.

For example, in a case where N0=16 (i.e., a0=1/16), N1=128 (i.e., a1=1/128), the context modeler 1420 may obtain updated P0' and P1' by using Equation, P0'=(Y>>4)+P0−(P0>>4); P1'=(Y>>7)+P1−(P1>>7), and may obtain a finally updated probability P by using Equation, P=(P0'+P1')>>1.

As described above, the probability used in the CABAC according to the present embodiment does not distinguish between an MPS and an LPS but indicates a probability of the predefined binary value, i.e., "1". While a probability of an LPS cannot exceed ½ according to the related art, the probability used in the embodiments of the present invention indicates the probability of the predefined binary value of "1", thus, the probability may exceed ½.

In a CABAC coding procedure, an entropy reset is performed at an interval of each slice unit. The entropy reset means that binary arithmetic coding discards a current probability value, and then newly performs CABAC coding based on a predetermined probability value. In a probability update that is performed after the entropy reset process, a probability value set as an initial value is not an optimal value, and when the update process is performed a plurality of times, the probability value converges to a constant probability value.

A probability $P_{init}$ that is reset after the entropy reset is performed may be set by using Equation, $P_{init}=\alpha+\beta*QP+\gamma*\Delta QP$, by using a difference value ΔQP between a current quantization parameter and a reference quantization parameter. α, β, and γ are weight values that are previously set according to a context model and a current slice type. The aforementioned Mi may also be changed in every initial process of the entropy reset, based on the context model and the current slice type.

Figure 16:
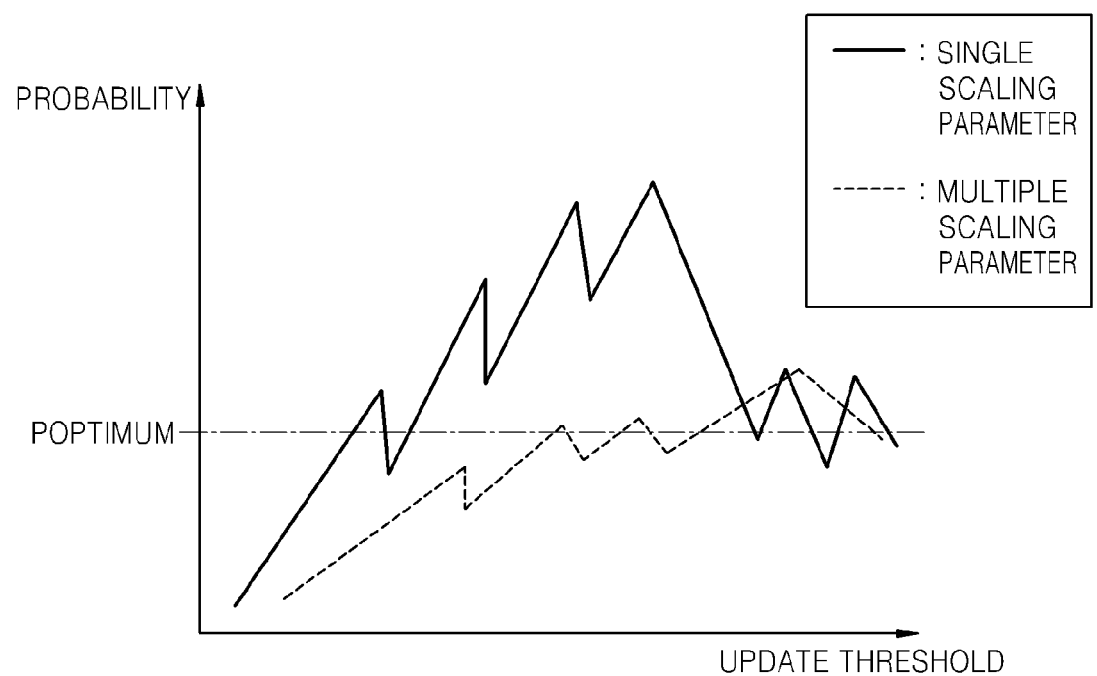
FIG. 16 is a graph for comparing a probability update process using a plurality of scaling factors with a probability update process using one scaling factor.

FIG. 16 is a graph for comparing a probability update process using a plurality of scaling factors with a probability update process using one scaling factor.

Referring to FIG. 16, in a case where a probability is updated by using one scaling factor, as a probability update is performed a plurality of times, the probability is to rapidly changed and thus rapidly converges to an appropriate value P_optimal but as the probability update is repeatedly performed, fluctuation may easily occur. In a case where a probability is updated by using a plurality of scaling factors, by using Equations 3, 4, etc. according to the embodiments of the present invention, although the probability is not rapidly changed, if the updated probability nearly converges to an appropriate value P_optimal) less fluctuation occurs so that the entropy encoding apparatus 1400 does not sensitively react to an error or noise but stably operates.

Thus, in consideration of the probability update process using one scaling factor or using the plurality of scaling factors, the context modeler 1420 may perform the probability update by using one scaling factor for a predetermined threshold after an entropy reset, and after the predetermined threshold, the context modeler 1420 may perform the probability update by using the plurality of scaling factors so as to achieve system stabilization.

Figure 17:
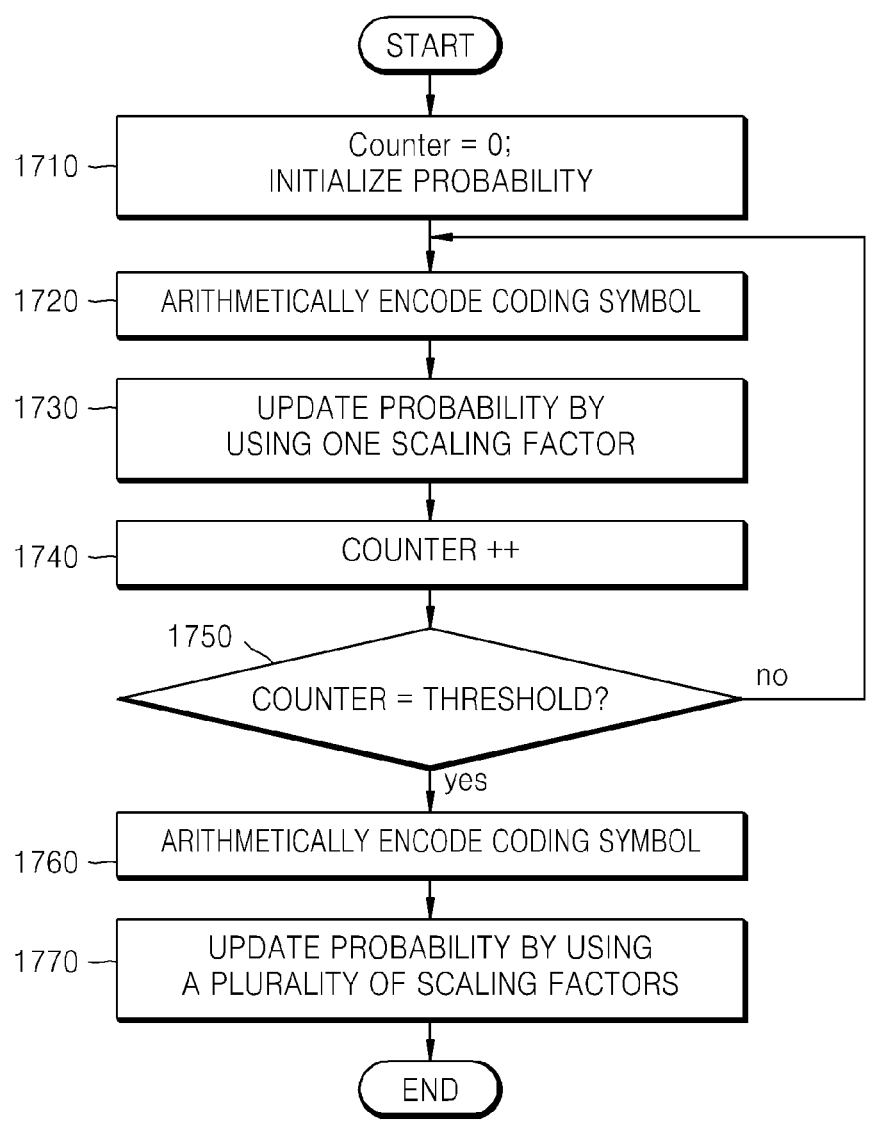
FIG. 17 is a flowchart of a process of updating a probability of a predefined binary value, according to an embodiment of the present invention.

FIG. 17 is a flowchart of a process of updating a probability of a predefined binary value, according to an embodiment of the present invention.

Referring to FIG. 17, in operation 1710, the context modeler 1420 initializes a counter and a probability after an entropy reset. In operation 1720, the context modeler 1420 performs binary arithmetic coding on an input coding symbol by using an initially-set probability.

In operation 1730, the context modeler 1420 updates the probability by using one scaling factor. In operation 1740, the context modeler 1420 increases the counter by 1 whenever the probability is updated. In operation 1750, the context modeler 1420 determines whether the counter reaches a predetermined threshold. The predetermined threshold may be defined as a window size. In operation 1760, the context modeler 1420 performs binary arithmetic coding on the coding symbol by using a last updated probability, and in operation 1770, the context modeler 1420 updates a probability of a predefined binary value by using a plurality of scaling factors. In a CABAC process thereafter, the context modeler 1420 updates the probability by using the plurality of scaling factors.

In a binary arithmetic coding process, partitioning of a probability range may be performed via direct calculation or by using a look-up table. In a case where the probability may be expressed as a K bit, a probability range L of the probability range which is with respect to a current coding symbol may be obtained by using Equation, L=(range*P+$2^{(k-1)}$)>>k.

Figure 18:
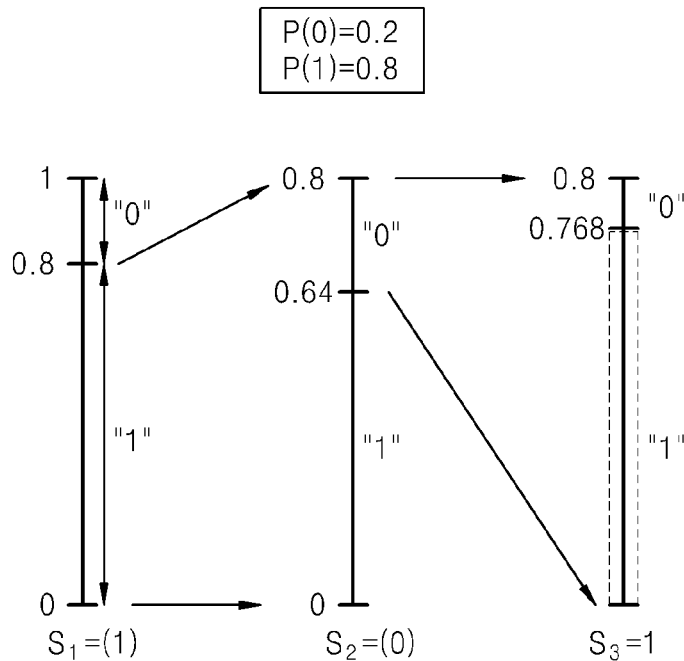
FIG. 18 illustrates a binary arithmetic coding procedure, according to an embodiment of the present invention.

FIG. 18 illustrates a binary arithmetic coding procedure, according to an embodiment of the present invention.

The context modeler 1420 provides an occurrence probability of a predefined binary value, e.g., an occurrence probability P(1) of "1", to the binary arithmetic coder 1430, and the binary arithmetic coder 1430 partitions a probability range in consideration of a probability of an input coding symbol, and performs binary arithmetic coding. In FIG. 18, it is assumed that the occurrence probability P(1) of "1"=0.8, and P(0)=0.2. For ease of description, it is assumed that P(1) and P(0) are fixed, but as described above, values of P(1) and P(0) may be updated whenever the coding symbol is encoded. Since a symbol $S_1$ that is first input has a value of 1, the binary arithmetic coder 1430 selects (0, 0.8) that is a probability range of the value of "1" in a range of (0, 1), since a symbol $S_2$ that is next input has a value of 0, the binary arithmetic coder 1430 selects (0.64, 0.8) that is an upward probability range corresponding to 0.2 in the range of (0, 0.8), and since a symbol $S_3$ that is last input has a value of 1, the binary arithmetic coder 1430 finally determines (0.64, 0.768) that is a range corresponding to 0.8 of (0.64, 0.8), and then the binary arithmetic coder 1430 selects 0.75 as a representative value indicating the range of (0.64, 0.768), and outputs "11" as a final bitstream, wherein "11" are decimal point values of 0.11 that is a binary value corresponding to 0.75. That is, input coding symbols "101" are encoded to "11".

Figure 19:
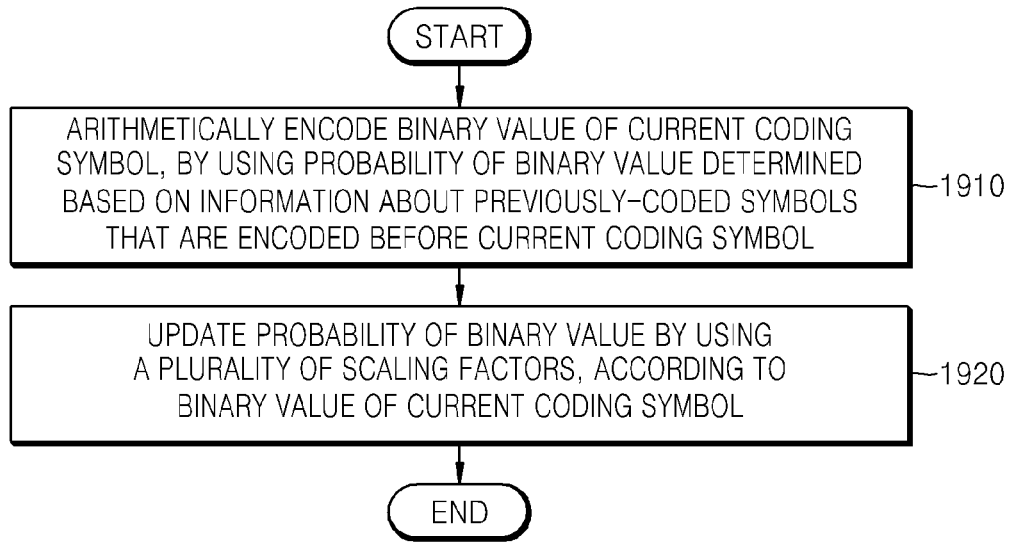
FIG. 19 is a flowchart of an entropy encoding method, according to an embodiment of the present invention.

FIG. 19 is a flowchart of an entropy encoding method, according to an embodiment of the present invention.

Referring to FIG. 19, in operation 1910, the binary arithmetic coder 1430 arithmetically encodes a binary value of a current coding symbol, by using a probability of a predefined binary value which is determined based on previously-coded symbols that are encoded before the current coding symbol.

In operation 1920, the binary arithmetic coder 1430 updates the probability of the predefined binary value by using a plurality of scaling factors, according to the binary value of the current coding symbol. As described above, the binary arithmetic coder 1430 may calculate a weighted average value of a plurality of probabilities that are generated by using the plurality of scaling factors, and thus may obtain a probability to be applied to a next coding symbol. Also, in a state where the probability is initialized after an entropy reset procedure, the binary arithmetic coder 1430 uses one scaling factor so as to allow the probability to rapidly converge to an appropriate value during an update process until a predetermined threshold is reached, and after the number of updating the probability exceeds the predetermined threshold, the binary arithmetic coder 1430 updates the probability by using the plurality of scaling factors so that an entire probability update procedure may rapidly and stably converge to an appropriate value.

Figure 20:
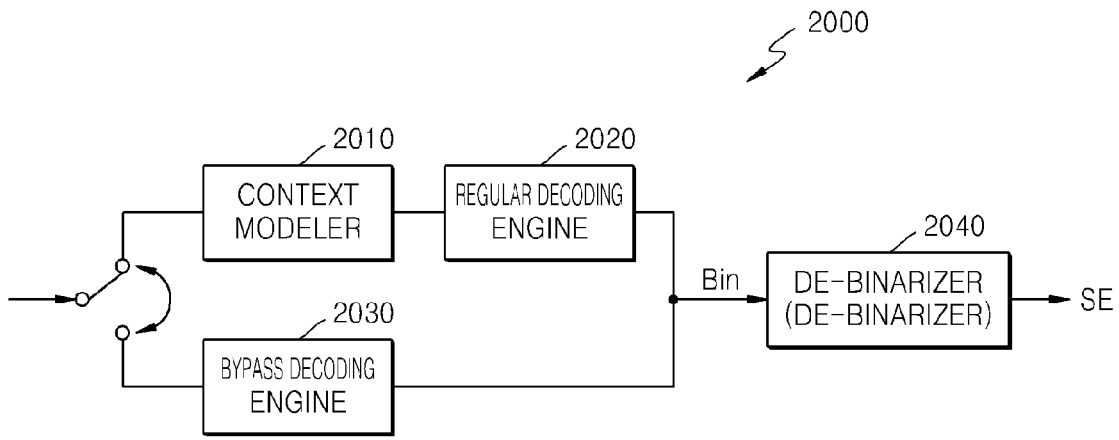
FIG. 20 is a block diagram illustrating a configuration of an entropy decoding apparatus, according to an embodiment of the present invention.

FIG. 20 is a block diagram illustrating a configuration of an entropy decoding apparatus 2000, according to an embodiment of the present invention.

Referring to FIG. 20, the entropy decoding apparatus 2000 includes a context modeler 2010, a regular decoding engine 2020, a bypass decoding engine 2030, and a de-binarizer 2040. The entropy decoding apparatus 2000 performs an inverse procedure of the entropy encoding procedure performed by the entropy encoding apparatus 1400.

A symbol that is encoded via bypass coding is output to and is decoded by the bypass decoding engine 2030, and a symbol that is encoded via regular coding is decoded by the regular decoding engine 2020. The regular decoding engine 2020 arithmetically decodes a binary value of a current coding symbol, by using a probability of a predefined binary value which is determined based on previously-coded symbols that are coded before the current coding symbol, and which is provided from the context modeler 2010. As described above, a binary value indicating a representative value of a predetermined probability range is transmitted as a symbol that is coded according to a binary arithmetic coding result, so that the regular decoding engine 2020 may decode the coded symbols by using occurrence probabilities of 0 and 1

The context modeler 2010 updates the probability of the predefined binary value by using a plurality of scaling factors according to the binary value of the decoded coding symbol. As described above, the context modeler 1420 does not distinguish between an MPS and an LPS but determines P(1) indicating an occurrence probability of a predefined binary value, e.g., "1", based on a previously-coded symbol, and provides a determined probability of the predefined binary value to the regular decoding engine 2020. The de-binarizer 2040 restores bin strings, which are restored by the regular decoding engine 2020 or the bypass decoding engine 2030, into a syntax element.

Figure 21:
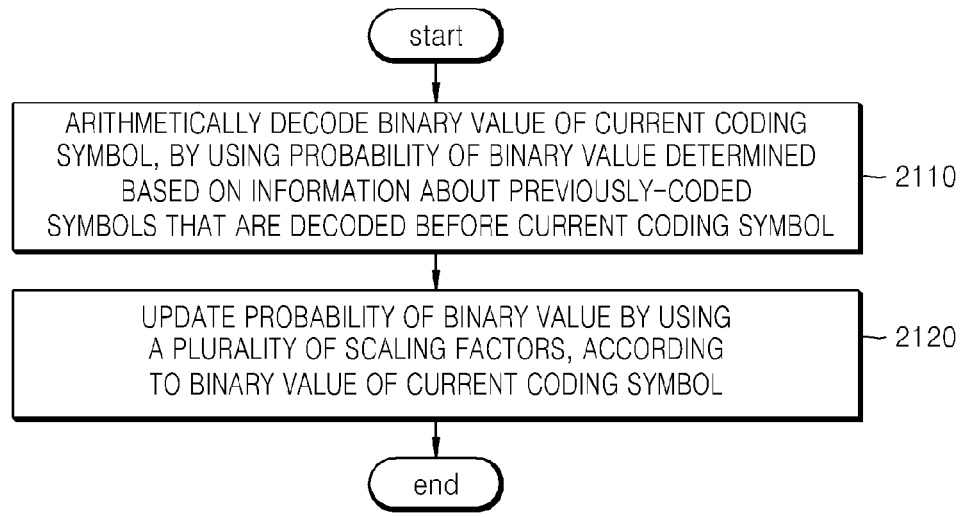
FIG. 21 is a flowchart of an entropy decoding method, according to an embodiment of the present invention.

FIG. 21 is a flowchart of an entropy decoding method, according to an embodiment of the present invention.

Referring to FIG. 21, the regular decoding engine 2020 arithmetically decodes a binary value of a current coding symbol, by using a probability of a predefined binary value which is determined based on previously-coded symbols that are coded before the current coding symbol.

In operation 2020, the context modeler 2010 updates the probability of the predefined binary value by using a plurality of scaling factors, according to the binary value of the current coding symbol. The context modeler 2010 may calculate a weighted average value of a plurality of probabilities that are generated by using the plurality of scaling factors, and thus may obtain a probability to be applied to a next coding symbol. Also, in a state where the probability is initialized after an entropy reset procedure, the context modeler 2010 uses one scaling factor so as to allow the probability to rapidly converge to an appropriate value during an update process until a predetermined threshold is reached, and after the number of updating the probability exceeds the predetermined threshold, the context modeler 2010 may update the probability by using the plurality of scaling factors.

The invention may also be embodied as computer readable codes on a computer readable recording medium. The computer readable recording medium is any data storage device that may store data which may be thereafter read by a computer system. Examples of the computer readable recording medium include read-only memory (ROM), random-access memory (RAM), CD-ROMs, magnetic tapes, floppy disks, optical data storage devices, etc. The computer readable recording medium may also be distributed over network coupled computer systems so that the computer readable code is stored and executed in a distributed fashion.

While this invention has been particularly shown and described with reference to preferred embodiments thereof, it will be understood by those of ordinary skill in the art that various changes in form and details may be made therein without departing from the spirit and scope of the invention as defined by the appended claims. Therefore, the scope of the invention is defined not by the detailed description of the invention but by the appended claims, and all differences within the scope will be construed as being included in the present invention.

The invention claimed is:

1. A method of entropy-encoding an image, the method comprising:
   arithmetically encoding a binary value of a current coding symbol, by using a probability of a predefined binary value which is determined based on previously-coded symbols that are encoded before the current coding symbol; and
   updating the probability of the predefined binary value by using a plurality of scaling factors, according to the binary value of the current coding symbol,
   wherein, when it is assumed that the plurality of scaling factors are ai (where ai is an real number less than 1, and i is an integer equal to or greater than 1), the probability of the predefined binary value determined based on information about the previously-coded symbols is P_old, a probability of a binary value updated by using the scaling factor ai is Pi_new, and y has a value of 0 or 1 depending on whether the current coding symbol has the predefined binary value, the updating comprises updating the probability of the predefined binary value by using a weighted average value of probabilities Pi_new of a plurality of updated binary values obtained by using Equation; Pi_new=ai*y+(1−ai)*P_old.

2. The method of claim 1, wherein the scaling factor ai is determined by using values of an exponentiation of 2.

3. The method of claim 2, wherein ai=1/(2^Mi) (where Mi is an integer), and the updated probability Pi_new of the binary value is obtained by using Equation; Pi_new=(y>>Mi)+P_old−(P_old>>Mi).

4. The method of claim 1, wherein, when a probability value is initialized, the updating by using the plurality of scaling factors is performed after a number of times the probability is updated exceeds a predetermined threshold.

5. The method of claim 4, wherein, when the probability value is initialized, if the number of times the probability is updated is equal to or less than the predetermined threshold, the probability is updated by using one scaling factor.

6. An entropy encoding apparatus for entropy-encoding an image, the entropy encoding apparatus comprising:
a binary arithmetic coder for arithmetically encoding a binary value of a current coding symbol, by using a probability of a predefined binary value which is determined based on previously-coded symbols that are encoded before the current coding symbol; and
a context modeler for updating the probability of the predefined binary value by using a plurality of scaling factors, according to the binary value of the current coding symbol,
wherein, when it is assumed that the plurality of scaling factors are ai (where ai is an real number less than 1, and i is an integer equal to or greater than 1), the probability of the predefined binary value determined based on information about the previously-coded symbols is P_old, a probability of a binary value updated by using the scaling factor ai is Pi_new, and y has a value of 0 or 1 depending on whether the current coding symbol has the predefined binary value,
the context modeler updates the probability of the predefined binary value by using a weighted average value of probabilities Pi_new of a plurality of updated binary values obtained by using Equation; Pi_new=ai*y+(1−ai)*P_old.

7. A method of entropy-decoding an image, the method comprising:
arithmetically decoding a binary value of a current coding symbol, by using a probability of a predefined binary value which is determined based on previously-coded symbols that are decoded before the current coding symbol; and
updating the probability of the predefined binary value by using a plurality of scaling factors, according to the binary value of the current coding symbol,
wherein, when it is assumed that the plurality of scaling factors are ai (where ai is an real number less than 1, and i is an integer equal to or greater than 1), the probability of the predefined binary value determined based on information about the previously-coded symbols is P_old, a probability of a binary value updated by using the scaling factor ai is Pi_new, and y has a value of 0 or 1 depending on whether the current coding symbol has the predefined binary value,
the updating comprises updating the probability of the predefined binary value by using a weighted average value of probabilities $P_i$_new of a plurality of updated binary values obtained by using Equation; $P_i$_new=$a_i$*y+(1−$a_i$)*P_old.

8. The method of claim 7, wherein the scaling factor ai is determined by using values of an exponentiation of 2.

9. The method of claim 8, wherein ai=1/(2^Mi) (where Mi is an integer), and the updated probability Pi_new of the binary value is obtained by using Equation; Pi_new=(y>>Mi)+P_old−(P_old>>Mi).

10. The method of claim 7, wherein, when a probability value is initialized, the updating by using the plurality of scaling factors is performed after a number of times the probability is updated exceeds a predetermined threshold.

11. The method of claim 10, wherein, when the probability value is initialized, if the number of times the probability is updated is equal to or less than the predetermined threshold, the probability is updated by using one scaling factor.

12. An entropy decoding apparatus for entropy-decoding an image, the entropy decoding apparatus comprising:
a binary arithmetic decoder for arithmetically decoding a binary value of a current coding symbol, by using a probability of a predefined binary value which is determined based on previously-coded symbols that are decoded before the current coding symbol; and
a context modeler for updating the probability of the predefined binary value by using a plurality of scaling factors, according to the binary value of the current coding symbol,
wherein, when it is assumed that the plurality of scaling factors are ai (where ai is an real number less than 1, and i is an integer equal to or greater than 1), the probability of the predefined binary value determined based on information about the previously-coded symbols is P_old, a probability of a binary value updated by using the scaling factor ai is Pi_new, and y has a value of 0 or 1 depending on whether the current coding symbol has the predefined binary value,
the context modeler updates the probability of the predefined binary value by using a weighted average value of probabilities $P_i$_new of a plurality of updated binary values obtained by using Equation; $P_i$_new=$a_i$*y+(1−$a_i$)*P_old.

* * * * *